US012796076B2

(12) United States Patent
Tu et al.

(10) Patent No.: US 12,796,076 B2
(45) Date of Patent: Nov. 10, 2026

(54) VERTICALLY STACKED TRANSISTORS AND FABRICATION THEREOF

(71) Applicants: TAIWAN SEMICONDUCTOR MANUFACTURING COMPANY, LTD., Hsinchu (TW); NATIONAL YANG MING CHIAO TUNG UNIVERSITY, Hsinchu City (TW)

(72) Inventors: Chien-Te Tu, Hsinchu City (TW); Chee-Wee Liu, Taipei City (TW)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 547 days.

(21) Appl. No.: 18/306,004

(22) Filed: Apr. 24, 2023

(65) Prior Publication Data

US 2024/0072054 A1 Feb. 29, 2024

Related U.S. Application Data

(60) Provisional application No. 63/401,357, filed on Aug. 26, 2022.

(51) Int. Cl.
*H10D 84/85* (2025.01)
*H10D 30/01* (2025.01)
(Continued)

(52) U.S. Cl.
CPC ......... *H10D 84/856* (2025.01); *H10D 30/014* (2025.01); *H10D 30/43* (2025.01);
(Continued)

(58) Field of Classification Search
CPC .... H10D 84/856; H10D 30/014; H10D 30/43; H10D 30/6729; H10D 30/6735;
(Continued)

(56) References Cited

U.S. PATENT DOCUMENTS

2020/0006329 A1 1/2020 Lilak et al.
2022/0223610 A1* 7/2022 Chhabra ............ H10D 30/6757
(Continued)

OTHER PUBLICATIONS

Herman et al., Epitaxy Physical Principles and Technical Implementation, 2004, Springer-Verlag Berlin Heidelberg GmbH, Chapter 4 (Solid Phase Epitaxy), pp. 45-62 (Year: 2004).*
(Continued)

*Primary Examiner* — William B Partridge
*Assistant Examiner* — Erik A. Anderson
(74) *Attorney, Agent, or Firm* — Birch, Stewart, Kolasch & Birch, LLP

(57) ABSTRACT

A device comprises a first semiconductor layer, a dielectric layer, a second semiconductor layer, and a gate structure. The first semiconductor layer is over a substrate. The first semiconductor layer comprises a first channel region and first source/drain regions on opposite sides of the first channel region. The dielectric layer is over the first semiconductor layer. The second semiconductor layer is over the dielectric layer. The second semiconductor layer comprises a second channel region and second source/drain regions on opposite sides of the second channel region. The gate structure comprises a first portion extending in the dielectric layer, a second portion wrapping around the first channel region of the first semiconductor layer, and a third portion wrapping around the second channel region of the second semiconductor layer.

20 Claims, 34 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2026.01) |
| ***H10D 84/03*** | (2025.01) |
| ***H10D 88/00*** | (2026.01) |

(52) U.S. Cl.

CPC ..... *H10D 30/6729* (2025.01); *H10D 30/6735* (2025.01); *H10D 62/121* (2025.01); *H10D 62/151* (2025.01); *H10D 84/0167* (2025.01); *H10D 84/017* (2025.01); *H10D 84/0186* (2025.01); *H10D 84/038* (2025.01); *H10D 88/01* (2025.01)

(58) Field of Classification Search

CPC ............... H10D 62/121; H10D 62/151; H10D 84/0167; H10D 84/017; H10D 84/0186; H10D 84/038; H10D 88/01; H10D 30/6757; H10D 84/85

See application file for complete search history.

(56) References Cited

U.S. PATENT DOCUMENTS

| | | | | |
|---|---|---|---|---|
| 2023/0178552 | A1* | 6/2023 | Huang | H10D 64/017 257/351 |
| 2023/0299086 | A1* | 9/2023 | Yu | H10D 30/43 |
| 2023/0420518 | A1* | 12/2023 | Kim | H10D 64/256 |
| 2024/0055429 | A1* | 2/2024 | Li | H10D 30/6729 |

OTHER PUBLICATIONS

Seebauer et al., Formation of Ultra-Shallow Junctions, Feb. 4, 2011,Comprehensive Semiconductor Science and Technology, vol. 4, pp. 86-131 (Year: 2011).*

Seebauer et al., Formation of Ultra-Shallow Junctions, Feb. 4, 2011, Comprehensive Semiconductor Science and Technology, vol. 4, pp. 86-131—PDF of Internet Version (Year: 2011).*

Shou et al., Feasibility Study of Single-Crystal Si Island Manufacturing by Microscale Printing of Nanoparticles and Laser Crystallization, Aug. 23, 2019, American Chemical Society (ACS) Publications, ACS Applied Materials & Interfaces, pp. 34416-34423 (Year: 2019).*

Ahmed et al., "Characterization of Low-Dielectric Constant Silicon Carbonitride (SiCN) Dielectric Films for Charge Trapping Non-volatile Memories," ECS Transactions, vol. 69, No. 3, 2015, pp. 99-109.

Alarcón-Flores et al., "Low interface states and high dielectric constant Y2O3 films on Si substrates," Journal of Vacuum Science & Technology B: Microelectronics and Nanometer Structures Processing, Measurement, and Phenomena, vol. 24, 2006, pp. 1873-1877.

Azadmanjiri et al., "A review on hybrid nanolaminate materials synthesized by deposition techniques for energy storage applications," Journal of Materials Chemistry A, vol. 2, 2014, pp. 3695-3708.

Cerniglia et al., "Dissolution of Germanium in Aqueous Hydrogen Peroxide Solution," Journal of The Electrochemical Society, vol. 109, No. 6, 1962, pp. 508-512.

Chehab et al., "Design-technology co-optimization of sequential and monolithic CFET as enabler of technology node beyond 2nm," Proceedings of SPIE, vol. 11614, 2021, pp. 116140D-1—116140D-5.

Chen et al., "Design and Optimization of SRAM Macro and Logic Using Backside Interconnects at 2nm node," 2021 IEEE International Electron Devices Meeting (IEDM), 2021, pp. 498-501.

Fenouillet-Beranger et al., "3D sequential integration: Opportunities, Breakthrough and Challenges," 2020 IEDM Conference Proceedings, 2020, Total pp. 81.

Gupta et al., "High-Aspect-Ratio Ruthenium Lines for Buried Power Rail," 2018 IEEE International Interconnect Technology Conference (IITC), 2018, pp. 4-6.

Huang et al., "3-D Self-aligned Stacked NMOS-on-PMOS Nanoribbon Transistors for Continued Moore's Law Scaling," 2020 IEEE International Electron Devices Meeting (IEDM), 2020 , pp. 425-428.

Lenka et al., "AlGaN/GaN-based HEMT on SiC substrate for microwave characteristics using different passivation layers," Pramana—journal of physics vol. 79, No. 1, Jul. 2012, pp. 151-163.

Loubet et al., "A Novel Dry Selective Etch of SiGe for the Enablement of High Performance Logic Stacked Gate-All-Around NanoSheet Devices," 2019 IEEE International Electron Devices Meeting (IEDM), 2019, pp. 242-245.

Nakamura et al., "Preparation of Pb(Zr,Ti)O3 Thin Films on Ir and IrO2 Electrodes," Japanese Journal of Applied Physics, vol. 33, pp. 5207-5210, 1994.

Ni et al., "Fundamental Understanding and Control of Device-to-Device Variation in Deeply Scaled Ferroelectric FETs," 2019 Symposium on VLSI Technology Digest of Technical Papers, 2019, pp. T40-T41.

Rachmady et al., "300mm Heterogeneous 3D Integration of Record Performance Layer Transfer Germanium PMOS with Silicon NMOS for Low Power High Performance Logic Applications," 2019 IEEE International Electron Devices Meeting (IEDM), 2019, pp. 697-700.

Ramana et al., "Nanocrystalline Pb(Zr0.52Ti0.48)O3 Ferroelectric Ceramics: Mechanical and Electrical Properties," Hindawi Publishing Corporation Journal of Nanomaterials, vol. 2010, Article ID 783043, 2010, pp. 1-8.

Subramanian et al., "First Monolithic Integration of 3D Complementary FET (CFET) on 300mm Wafers," 2020 IEEE Symposium on VLSI Technology, 2020, Total pp. 3.

Tsai et al., "Highly Stacked 8 Ge0.9Sn0.1 Nanosheet pFETs with Ultrathin Bodies (~3nm) and Thick Bodies (~30nm) Featuring the Respective Record ION/IOFF of 1.4×107 and Record ION of 92 μA at VOV=VDS=−0.5V by CVD Epitaxy and Dry Etching," 2021 IEEE International Electron Devices Meeting (IEDM), 2021, pp. 569-572.

Zangenberg et al., "Boron and phosphorus diffusion in strained and relaxed Si and SiGe," Journal of Applied Physics, vol. 94, No. 6, Sep. 15, 2003, pp. 3883-3890.

* cited by examiner

VERTICALLY STACKED TRANSISTORS AND FABRICATION THEREOF

PRIORITY CLAIM AND CROSS-REFERENCE

This application claims priority to U.S. Provisional Patent Application No. 63/401,357, filed Aug. 26, 2022, which is incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
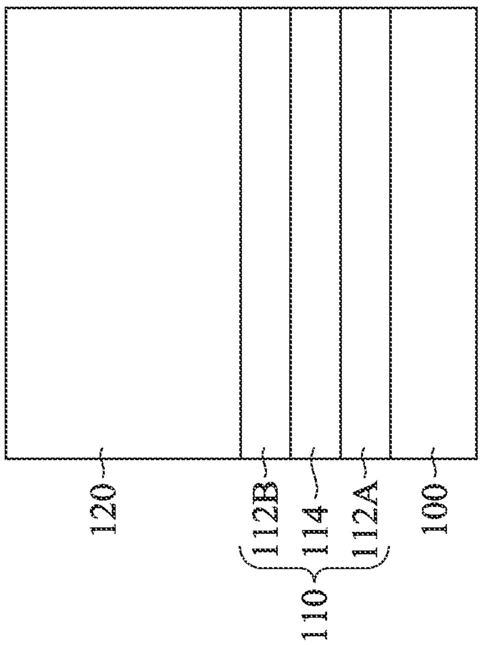
FIGS. 1-3 are cross-sectional views of intermediate stages in forming a CFET structure, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the size of semiconductor devices become smaller, a cell height of standard cells also becomes smaller. To reduce the cell height, a complementary FET (CFET) scheme in which a p-type FET and an n-type FET are vertically stacked has been proposed. The CFET scheme may use a wafer bonding process, which bonds a top-tier wafer (i.e., wafer at a higher level) having transistors of first conductivity type (e.g., p-type) to a bottom-tier wafer (i.e., wafer at lower level height) having transistors of second conductivity type (e.g., n-type). Such fabrication process may cause additional cost (e.g., cost in wafer bonding), and may also cause limited thermal budge in processing steps of devices in top-tier wafer after wafer bonding, because the processing temperature after wafer bonding would be constrained by metal interconnect reliability in the bottom-tier wafer. If the CFET scheme is not fabricated using wafer bonding, then it may rely upon complicated processes for forming n-type epitaxial structures and p-type epitaxial structures that are vertically stacked and isolated by an interposing dielectric.

The present disclosure provides, in various embodiments, a CFET scheme comprising single crystal islands formed on a dielectric layer on a bottom epitaxial stack. The single crystal islands serve as seeds for epitaxially growing a top epitaxial stack. The bottom epitaxial stack and the top epitaxial stack respectively serve to form NFETs and PFETs. Therefore, the CFETs can be formed without wafer bonding, and thus thermal budget of top-tier devices (i.e., devices formed in the top epitaxial stack) will not be constrained by reliability concerns about bottom-tier devices (i.e., devices formed in the bottom epitaxial stack). Moreover, n-type source/drain regions of CFETs can be formed by thermal diffusion using n-type epitaxial layers in the epitaxial stacks as n-type dopant sources, p-type source/drain regions of CFETs can be formed by thermal diffusion using p-type epitaxial layers in the epitaxial stacks as p-type dopant sources, and thus complicated epitaxial growth for forming vertically arranged n-type epitaxial structures and p-type epitaxial structures can be skipped.

FIGS. 1-20D illustrate top views and cross-sectional views of intermediate stages of a method of forming a CFET structure in accordance with some embodiments. Although cross-sectional views and top views shown in FIGS. 1-20D are described with reference to a method, it will be appreciated that the structures shown in FIGS. 1-20D are not limited to the method but rather may stand alone separate of the method. Although FIGS. 1-20D are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

FIG. 1 is a cross-sectional view of an intermediate stage in forming a CFET structure. In FIG. 1, a semiconductor substrate 100 is illustrated. In some embodiments, the substrate 100 may be a semiconductor substrate, such as a bulk semiconductor substrate, a semiconductor-on-insulator (SOI) substrate, a multi-layered or gradient substrate, or the like. The substrate 100 may include a semiconductor material, such as an elemental semiconductor including Si and Ge; a compound or alloy semiconductor including SiC, SiGe, GeSn, GaAs, GaP, GaAsP, AlInAs, AlGaAs, GaInAs, InAs, GaInP, InP, InSb, GaInAsP; a combination thereof, or the like. The substrate 100 may be doped or substantially un-doped. In a specific example, the substrate 100 is a bulk silicon substrate, which may be a wafer.

FIG. 1 also illustrates a bottom-tier epitaxial stack 110 formed over the semiconductor substrate 100. The bottom-tier epitaxial stack 110 comprises one or more first semiconductor layers 112A-112B (collectively referred to as first semiconductor layers 112) alternating with one or more second semiconductor layers 114. The bottom-tier epitaxial stack 110 is illustrated as including two first semiconductor layers 112 and one second semiconductor layer 114 for illustrative purposes. In some embodiments, the bottom-tier epitaxial stack 110 may include any number of the first semiconductor layers 112 and the second semiconductor layers 114. Each of the layers of the bottom-tier epitaxial stack 110 may be epitaxially grown using a process such as chemical vapor deposition (CVD), atomic layer deposition (ALD), vapor phase epitaxy (VPE), molecular beam epitaxy (MBE), or the like.

For purposes of illustration and as discussed in greater detail below, portions of the first semiconductor layers 112 will be removed and the second semiconductor layers 114 will be patterned to form channel regions of bottom-tier gate-all-around (GAA) transistors. In some embodiments, the first semiconductor layers 112 are doped with an n-type dopant (e.g., phosphorous) or a p-type dopant (e.g., boron), which will be diffused into source/drain regions of the second semiconductor layer 114 in subsequent processing. The first semiconductor layers 112 are thus interchangeably referred to as dopant source layers in some embodiments. The second semiconductor layers 114 will become nanosheets, nanowires, nanoslabs or nanorings that include channel regions and source/drain regions formed on opposite sides of channel regions in subsequent processing. The semiconductor layers 114 can be interchangeably referred to as semiconductor active layers providing semiconductor channels, sources, and drains for bottom-tier transistors.

In some embodiments, the dopant source layers 112 and the semiconductor active layers 114 are made of different materials selected from the group consisting of Si, Ge, Sn, $Si_{1-x}Ge_x$, $Ge_{1-y}Sn_y$, $Si_{1-x-y}Ge_xSn_y$, III-V compound, and combinations thereof. Because of the material difference, in subsequent processing, the dopant source layers 112 can be selectively etched without substantially etching the semiconductor active layers 114.

In some embodiments where the semiconductor active layer 114 serves to form an NFET, the dopant source layers 112 are SiGe doped with an n-type dopant (e.g., phosphorous), and the semiconductor active layer 114 is an un-doped Si layer (e.g., pure silicon layer). The lattice constant difference between Si and SiGe results in a tensile strain/stress on the semiconductor active layer 114, which in turn aids in forming a tensile-strained channel region in the semiconductor active layer 114, which in turn increases electron mobility in the channel region in the semiconductor active layer 114. In some other embodiments, the dopant source layers 112 are Ge layers doped with an n-type dopant (e.g., phosphorous), and the semiconductor active layer 114 is an un-doped SiGe layer. The lattice constant difference between Ge layers and SiGe layer also results in a tensile strain/stress on the semiconductor active layer 114, which in turn aids in forming a tensile-strained channel region in the semiconductor active layer 114, which in turn increases electron mobility in the channel region in the semiconductor active layer 114.

In some embodiments wherein the semiconductor active layer 114 serves to form a PFET, the dopant source layers 112 are SiGe doped with a p-type dopant (e.g., boron), and the semiconductor active layer 114 is an un-doped Si layer. In some other embodiments of a PFET, the dopant source layers 112 are Ge doped with a p-type dopant, and the semiconductor active layer 114 is an un-doped GeSn layer. The lattice constant difference between Ge and GeSn results in a compressive strain/stress on the semiconductor active layer 114, which in turn aids in forming a compressive-strained channel region in the semiconductor active layer 114, which in turn increases hole mobility in the channel region in the semiconductor active layer 114.

In some embodiments, the dopant source layers 112 may have a dopant concentration (e.g., n-type impurity concentration or p-type impurity concentration) greater than about $1\times10^{20}$ atoms/$cm^3$. If the dopant source layers 112 have excessively low dopant concentration (e.g., lower than $1\times10^{20}$ atoms/$cm^3$), then the resultant bottom-tier transistors will have excessively high source/drain parasitic resistance. In some embodiments, the dopant source layers 112 may be in situ doped with an n-type dopant during epitaxial growth, if the semiconductor active layer 114 serves to form NFETs. In some embodiments, the dopant source layers 112 may be in situ doped with a p-type dopant during epitaxial growth, if the semiconductor active layer 114 serves to form PFETs. In some embodiments, the semiconductor active layer 114 has a thickness in a range from about 0.1 nm to about 100 nm. In some embodiments, the dopant source layers 112 have a thickness in a range from about 0.1 nm to about 100 nm. In some embodiments, the semiconductor active layer 114 is thinner or thicker than the dopant source layers 112. In some embodiments, the semiconductor active layer 114 has a same thickness as the dopant source layers 112.

FIG. 1 also illustrates an inter-tier dielectric layer 120 formed over the bottom-tier epitaxial stack 110 using, for example, CVD, ALD, physical vapor deposition (PVD), or the like. In some embodiments, the inter-tier dielectric layer 120 may be made of silicon oxide ($SiO_2$) or other suitable dielectric materials. The inter-tier dielectric layer 120 can be formed by any suitable method, such as spin-on coating, chemical vapor deposition (CVD), plasma-enhanced CVD (PECVD), or the like. In some embodiments, the inter-tier dielectric layer 120 has a thickness in a range from about 0.1 nm to about 1 μm. In some embodiments, the thickness of inter-tier dielectric layer 120 is greater than a thickness of each layer of the bottom-tier epitaxial stack 110.

Figure 2:
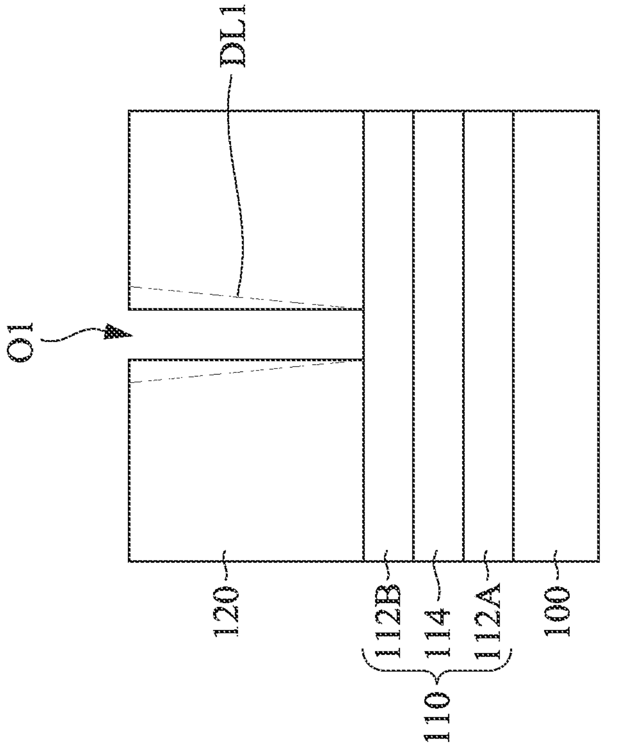

FIG. 2 illustrates a cross-sectional view of a following stage in the CFET structure fabrication. As illustrated in FIG. 2, a patterning process is performed on the inter-tier dielectric layer 120 to form one or more holes O1 in the inter-tier dielectric layer 120, until the topmost dopant source layer 112B of the bottom-tier epitaxial stack 110 gets exposed at bottoms of the one of more holes O1. The hole O1 thus extends through a full thickness of the inter-tier dielectric layer 120 to reach the bottom-tier epitaxial stack 110. The inter-tier dielectric layer 120 is patterned using suitable photolithography and etching techniques. For example, a photoresist layer is formed over the inter-tier dielectric layer 120 by using a spin-on coating process, followed by patterning the photoresist layer to expose target regions of the inter-tier dielectric layer 120 using suitable photolithography techniques. For example, photoresist layer is irradiated (exposed) and developed to remove portions of the photoresist layer. In greater detail, a photomask or reticle (not shown) may be placed above the photoresist layer, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist layer, and a developer may be used to remove either the exposed or unexposed portions of the photoresist material depending on whether a positive or negative resist is used. After the patterned photoresist layer is formed, an etching process is performed on the exposed target regions of the inter-tier dielectric layer 120, thus forming one or more holes O1 in the inter-tier dielectric layer 120. Although the hole O1 illustrated in FIG. 2 have vertical sidewalls, the etching process may lead to tapered sidewalls, as indicated by dash line DL1, in some other embodiments.

Figure 3:
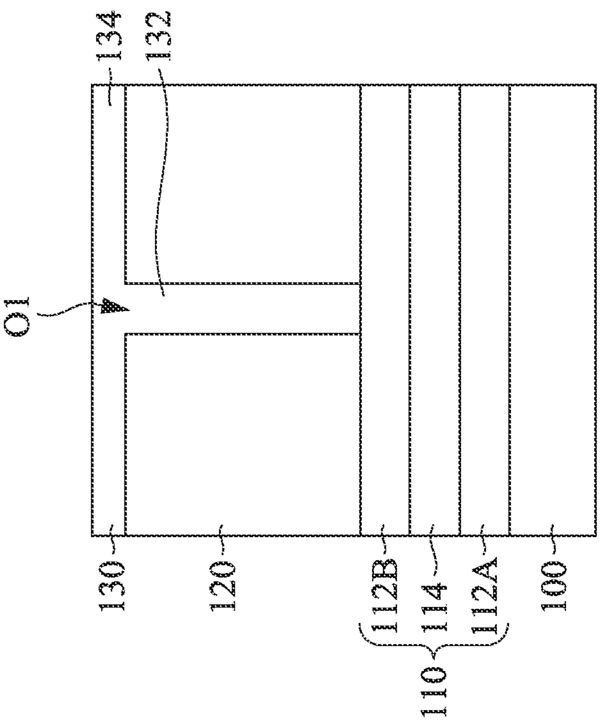

FIG. 3 illustrates a cross-sectional view of a following stage in the CFET structure fabrication. As illustrated in FIG. 3, a semiconductor layer 130 is formed over the inter-tier dielectric layer 120 using suitable deposition techniques. The deposited semiconductor layer 130 is non-single crystalline. In particular, the deposited semiconductor layer 130 is amorphous and/or polycrystalline. The semiconductor layer 130 includes silicon (Si), germanium (Ge), silicon germanium (SiGe), or other semiconductor materials. In some embodiments, the semiconductor layer 130 is formed of a same material as the dopant source layers 112 in the bottom-tier epitaxial stack 110, so that the semiconductor layer 130 can be selectively etched simultaneously with selectively etching the dopant source layers 112 in subsequent processing. For example, the semiconductor layer 130 and the dopant source layers 112 may be formed of SiGe. In some embodiments, the semiconductor layer 130 is formed of un-doped SiGe different from the n-type doped SiGe or p-type doped SiGe of the dopant source layers 112. This is because the semiconductor layer 130 is spaced apart from the semiconductor active layer 114 and hence does not serve as a dopant source for forming source/drain regions in the semiconductor active layer 114. As a result, the semiconductor layer 130 differs from the dopant source layers 112 at least in n-type dopant concentration or p-type dopant concentration. In particular, if the dopant source layers 112 are n-type doped SiGe for forming NFETs, the dopant source layers 112 have a higher n-type dopant concentration than the semiconductor layer 130; and if the dopant source layers 112 are p-type doped SiGe for forming PFETs, the dopant source layers 112 have a higher p-type dopant concentration than the semiconductor layer 130.

In some embodiments where the semiconductor layer 130 is SiGe, the silicon layer may be deposited by using silicon-containing gases (e.g., $SiH_4$, $Si_2H_6$) and germanium-containing gases (e.g., $GeH_4$, $Ge_2H_6$) as precursor gases, accompanied with a carrier gas including He, $N_2$, $H_2$, Ar, other suitable carrier gases, or combinations thereof. The processing gases for forming the SiGe layer 130 is intended to be illustrative and is not intended to be limiting to embodiments of the present disclosure. Rather, any suitable processes and associated process conditions may be used.

Silicon atoms and/or germanium atoms of the semiconductor layer 130 deposited on the inter-tier dielectric layer 120 tend to form an amorphous solid (i.e., non-crystalline solid) that lacks the long-range order of a crystal, because the dielectric material of the inter-tier dielectric layer 120 is amorphous in nature. At an initial stage, the amorphous semiconductor layer 130 is conformally deposited into the one or more holes O1 in the inter-tier dielectric layer 120 and on a top surface of the inter-tier dielectric layer 120, and the deposition process then continues until the one or more holes O1 in the inter-tier dielectric layer 120 are overfilled with the amorphous semiconductor layer 130.

Figure 6:
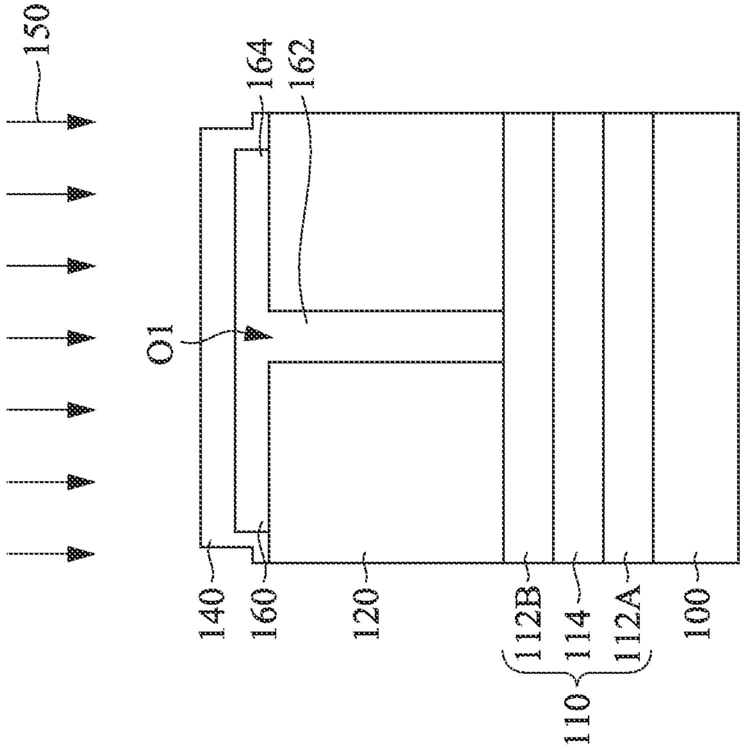

As a result of the deposition process, the amorphous semiconductor layer 130 includes amorphous semiconductor plugs 132 extending in the one or more holes O1 in the inter-tier dielectric layer 120, and an amorphous semiconductor lateral portion 134 extending along a top surface of the inter-tier dielectric layer 120. Height of the amorphous semiconductor plugs 132 is equal to the depth of the one or more holes O1 in the inter-tier dielectric layer 120, and thus is equal to the thickness of the inter-tier dielectric layer 120. Thickness of the amorphous semiconductor lateral portion 134 can be less than, greater than, or equal to the height of the amorphous semiconductor plugs 132. In some embodiments, the amorphous semiconductor plugs 132 have a height much greater than the thickness of the amorphous semiconductor lateral portion 134. Such a vertical dimension difference allows for melting the non-crystalline semiconductor material in the subsequent liquid phase epitaxy (LPE) process (as shown in FIG. 6), while not melting the bottom-tier epitaxial stack 110. For example, a ratio of the height of the amorphous semiconductor plugs 132 to the thickness of the amorphous semiconductor lateral portion 134 is greater than 2, 3, 4, 5, 6, 7, 8, 9, 10, or more. In some embodiments, the thickness of the amorphous semiconductor lateral portion 134 is greater than 0 and less than about 1 μm.

Figure 4B:
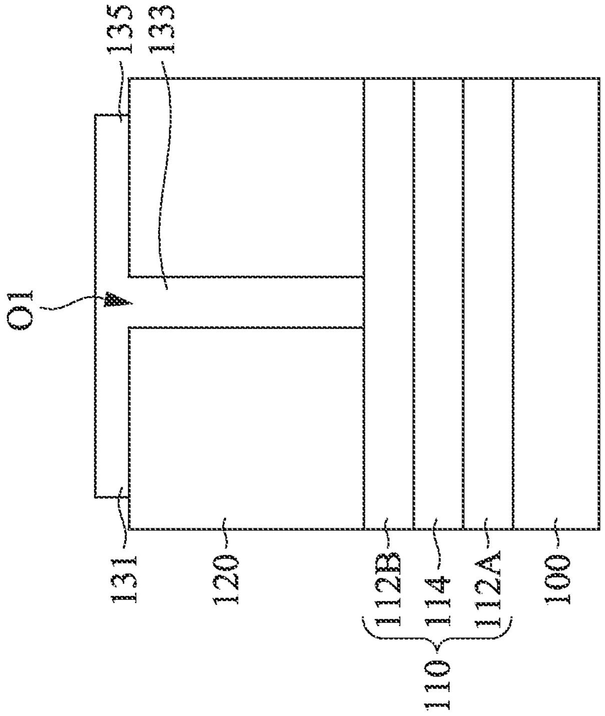
FIGS. 4A and 4B illustrate a top view and a cross-sectional view of an intermediate stage in the CFET structure fabrication, according to some embodiments of the present disclosure.
Figure 4A:
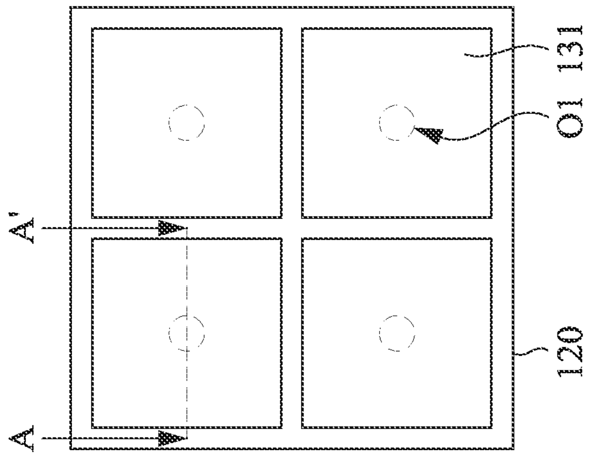

FIGS. 4A and 4B illustrate a top view and a cross-sectional view of a following stage in the CFET structure fabrication, wherein FIG. 4B is a cross-sectional view obtained from cut A-A' in FIG. 4A. As illustrated in FIGS. 4A and 4B, the non-crystalline semiconductor layer 130 is patterned into a plurality of non-crystalline semiconductor islands 131 separated from each other by using suitable photolithography and etching techniques. For example, a photoresist layer can be formed on non-crystalline semiconductor layer 130 by using a spin-coating technique. The photoresist layer is then patterned using exposure and development processes, leaving a patterned photoresist layer having a pattern corresponding to a target pattern of the non-crystalline semiconductor islands 131. Next, an etching process, such as reactive ion etching (RIE) or inductively coupled plasma (ICP) etching, can be employed to remove portions of the non-crystalline semiconductor layer 130 not protected by the patterned photoresist layer. The etching process may use a plasma-containing reactive species to selectively etch the exposed non-crystalline semiconductor material, creating the target pattern of non-crystalline semiconductor islands 131. In some embodiments, the etching process uses an etchant chemistry that selectively etches the non-crystalline semiconductor layer 130 (e.g., amorphous silicon germanium) while having no or negligible etch rate for the inter-tier dielectric layer 120 (e.g., silicon oxide). For example, the selective etching process may use a fluorine-based chemistry, such as hexafluoride ($SF_6$) or carbon tetrafluoride ($CF_4$), in a controlled plasma environment. The non-crystalline semiconductor islands 131 respectively overlap corresponding holes O1, and thus the non-crystalline semiconductor islands 131 each comprise a non-crystalline semiconductor plug 133 extending in the holes O1 in the inter-tier dielectric layer 120, and a non-crystalline semiconductor lateral portion 135 extending along a top surface of the inter-tier dielectric layer 120. In some embodiments, as illustrated in FIG. 4A, the holes O1 are arranged substantially equidistantly in an array of rows and columns, and the non-crystalline semiconductor islands 131 are square islands corresponding to the holes O1 in an one-to-one manner. In particular, the square islands 131 are arranged substantially equidistantly in an array of rows and columns.

Figure 5B:
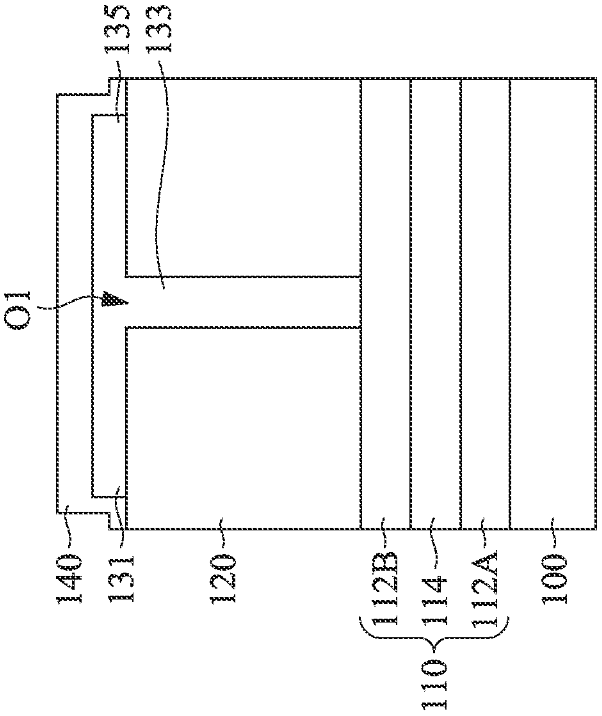
FIGS. 5A and 5B illustrate a top view and a cross-sectional view of an intermediate stage in the CFET structure fabrication, according to some embodiments of the present disclosure.
Figure 5A:
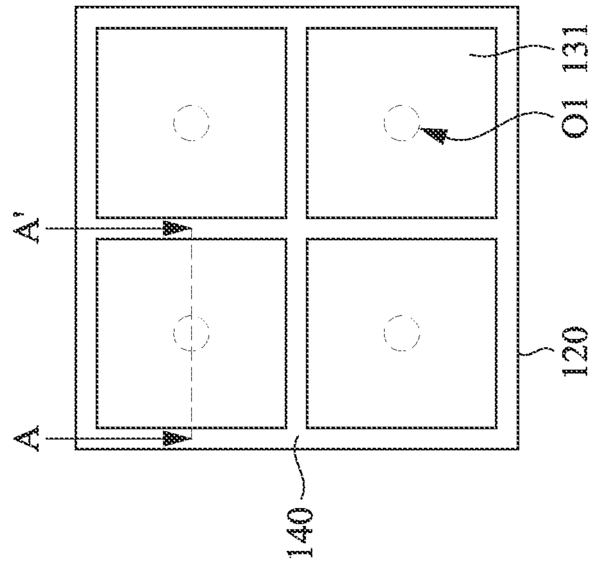

FIGS. 5A and 5B illustrate a top view and a cross-sectional view of a following stage in the CFET structure fabrication, wherein FIG. 5B is a cross-sectional view obtained from cut A-A' in FIG. 5A. As illustrated in FIGS. 5A and 5B, a capping layer 140 is conformally deposited over the non-crystalline semiconductor islands 131. In some embodiments, the capping layer 140 can serve to reduce heat dissipation rate from top surfaces and sidewalls of the amorphous semiconductor islands 131 and from a top surface of the inter-tier dielectric layer 120 in the subsequent cooling down step after laser annealing, thus allowing bottoms of holes O1 to have a faster heat dissipation rate than the top surface of the inter-tier dielectric layer 120 during cooling down, which in turn will aid in initiating nucleation of single-crystalline semiconductor material almost only at the bottoms of holes O1, rather than initiating nucleation from the top surface of the inter-tier dielectric layer 120. In some embodiments, the capping layer 140 includes, for example, silicon nitride, aluminum oxide or other suitable materials. In some embodiments, the capping layer 140 is formed using ALD, although other deposition techniques, such as CVD, PVD, PEALD, may be used.

FIG. 6 illustrates a cross-sectional view of a following stage in the CFET structure fabrication. As illustrated in FIG. 6, a crystallization process 150 is performed to convert the non-crystalline semiconductor islands 131 into single-crystalline semiconductor islands 160. In some embodiments, crystallization of the non-crystalline semiconductor islands 131 can be performed using, for example, a laser anneal, a rapid thermal anneal (RTA), a millisecond anneal (mSA), the like or combinations thereof, which raises temperature to a peak temperature higher than deposition temperature of the non-crystalline semiconductor islands 131. In greater detail, the non-crystalline semiconductor islands 131 can heated to a peak temperature higher than a melting point of non-crystalline semiconductor islands 131, so as to melt the non-crystalline semiconductor islands 131 into a molten state (i.e., liquid phase), and then the molten non-crystalline semiconductor will be crystallized upon cooling down. Because crystallization of the molten amorphous semiconductor takes place using the underlying single-crystalline semiconductor layer 112B as a seed layer, the resultant crystallized semiconductor islands 160 will be single-crystalline instead of polycrystalline, and thus can be referred to as single-crystalline semiconductor islands 160. This crystallization process is also called liquid phase epitaxy (LPE) process, which results in single-crystalline islands 160 that can serve as seeds for following epitaxial growth of forming a top-tier epitaxial stack. In some embodiments, the single-crystalline semiconductor islands 160 may have a different shape and/or size than the amorphous semiconductor islands 131, because the crystallization process 150 turns the semiconductor material into liquid phase.

Example crystallization process 150 of the non-crystalline semiconductor islands 131 is performed by the laser anneal. The laser may be pulsed laser or a continuous wave laser that is directed toward top surfaces of the non-crystalline semiconductor islands. Because the non-crystalline semiconductor islands 131 is raised above the bottom-tier epitaxial stack 110 by significantly thick inter-tier dielectric layer 120 (e.g., with thickness in a range from about 150 nm to about 500 nm), the non-crystalline semiconductor islands 131 can be spaced apart from the bottom-tier epitaxial stack 110 by a distance that is long enough to create a significant temperature difference between the amorphous semiconductor islands 131 and the bottom-tier epitaxial stack 110 during the laser anneal, which in turn allows for melting the amorphous semiconductor islands 131 while not significantly melting materials in the bottom-tier epitaxial stack 110. The crystallization process thus results in low or negligible thermal budget on the bottom-tier epitaxial stack 110.

In the crystallization process 150, various lasers such as a XeCl or other excimer lasers may be used. The laser energy is adjusted to selectively melt amorphous semiconductor islands 131 but not intentionally melt the underlying materials (e.g., materials in bottom-tier epitaxial stack 110). Various energies may be used and may depend upon the melting point of amorphous semiconductor islands 131. For a pulsed laser, the laser energy may further depend on the number and/or frequency of pulses used and the power density and energy are chosen in conjunction with the thickness of the amorphous semiconductor islands 131. The laser power may be in a range from 0 to about 20 Watts.

The wavelength of laser light is chosen to be a wavelength that is absorbable by amorphous semiconductor and in an exemplary embodiment, a wavelength less than 11000 Å may be used. The pulsed laser causes the amorphous semiconductor islands 131 to substantially or completely melt while most or all underlying materials remain a solid material. The amorphous semiconductor islands 131 may be in completely or substantially molten state from its top surface to its bottommost surface within the inter-tier dielectric layer 120. In some embodiments, because the bottommost surfaces of the amorphous semiconductor islands 131 are lower than a top surface of the inter-tier dielectric layer 120, at least upper portion of the inter-tier dielectric layer 120 may be unintentionally molten in order to completely melt the amorphous semiconductor islands 131. Moreover, in some embodiments, top portions of the dopant source layer 112B may also be unintentionally molten in order to completely melt the amorphous semiconductor islands 131.

Once the laser anneal process stops, the molten amorphous semiconductor cools down and thus starts to crystallize into the single-crystalline islands 160, each of which includes a single-crystalline semiconductor plug 162 extending in the holes O1 in the inter-tier dielectric layer 120, and a single-crystalline semiconductor lateral portion 164 laterally extending along a top surface of the inter-tier dielectric layer 120. During cooling down, the capping layer 140 can serve to reduce heat dissipation rate from top surfaces and sidewalls of the amorphous semiconductor islands 131 and a top surface of the inter-tier dielectric layer 120, which in turn reduces a heat dissipation rate from top surfaces and sidewalls of the amorphous semiconductor islands 131 and top surface of the inter-tier dielectric layer 120 to be less than a heat dissipation rate at the bottoms of holes O1. Therefore, bottoms of holes O1 have a faster heat dissipation rate than the top surface of the inter-tier dielectric layer 120 during cooling down. The heat dissipation rate difference thus results in a lower temperature at bottoms of holes O1 than at the top surface of the inter-tier dielectric layer 120, which in turn aids in initiating nucleation of single-crystalline semiconductor material almost only at the bottoms of holes O1, rather than initiating nucleation from the top surface of the inter-tier dielectric layer 120.

Because the nucleation of semiconductor material begins from the bottom of holes O1, the single-crystalline semiconductor layer 112B at the bottom of holes O1 provides single-crystalline nucleation cites so that after cooling down the resultant semiconductor material becomes single-crystalline. As a result, the semiconductor islands 160 may have no grain boundary. Moreover, the capping layer 140 can also serve to prevent adjacent semiconductor islands 160 from merging during the crystallization process 150, which in turn reduces the risk of forming grain boundaries and/or crystal defects such as dislocations. In some embodiments, the molten amorphous semiconductor can be reheated before spontaneous nucleation on the inter-tier dielectric layer 120 begins, which in turn aids in initiating nucleation at the bottoms of holes O1 in the inter-tier dielectric layer 120, because the spontaneous nucleation above the top surface of the inter-tier dielectric layer 120 can be suppressed by the reheating.

Figure 7:
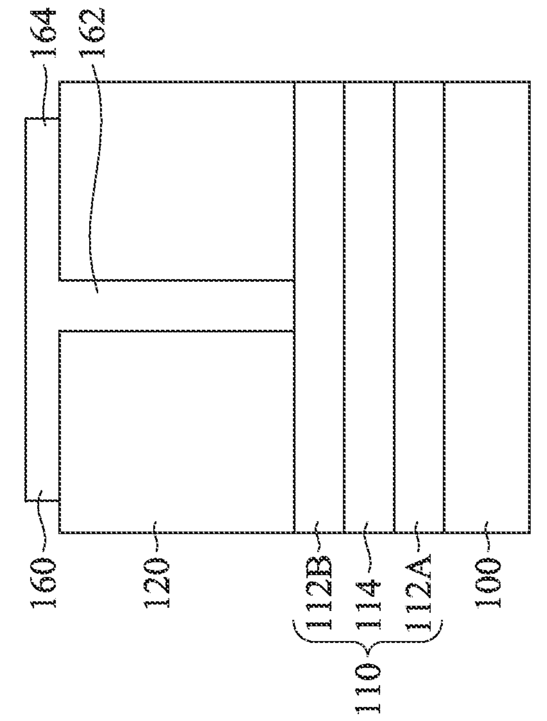
FIGS. 6-8 are cross-sectional views of intermediate stages in forming a CFET structure, according to some embodiments of the present disclosure.

FIG. 7 illustrates a cross-sectional view of a following stage in the CFET structure fabrication. As illustrated in FIG. 7, once the crystallization process 150 is completed, the capping layer 140 is removed by using suitable etching techniques. In some embodiments, the capping layer 140 is removed using a selective etching process that selectively etches the capping layer 140 without substantially etching the single-crystalline semiconductor islands 160 and the inter-tier dielectric layer 120. In some embodiments where the capping layer 140 is silicon nitride, the silicon nitride layer 140 can be selectively removed by using phosphoric acid as an etchant, with no or negligible etching amount in the single-crystalline semiconductor islands 160 and the inter-tier dielectric layer 120. Although the capping layer 140 is performed by a selective etching process, the etchant chemistry may unintentionally cause etching amount in the single-crystalline semiconductor islands 160 and the inter-tier dielectric layer 120 in some embodiments. In that scenario, the single-crystalline semiconductor islands 160 may have a different sidewall profile than before removing the capping layer 140. For example, the single-crystalline semiconductor islands 160 may have a tapered sidewall profile. Stated differently, the single-crystalline semiconductor islands 160 may have a horizontal dimension (i.e., width) decreasing from bottoms to tops of the single-crystalline semiconductor islands 160, because of unintentional lateral etching in sidewalls of the single-crystalline semiconductor islands 160.

Figure 8:
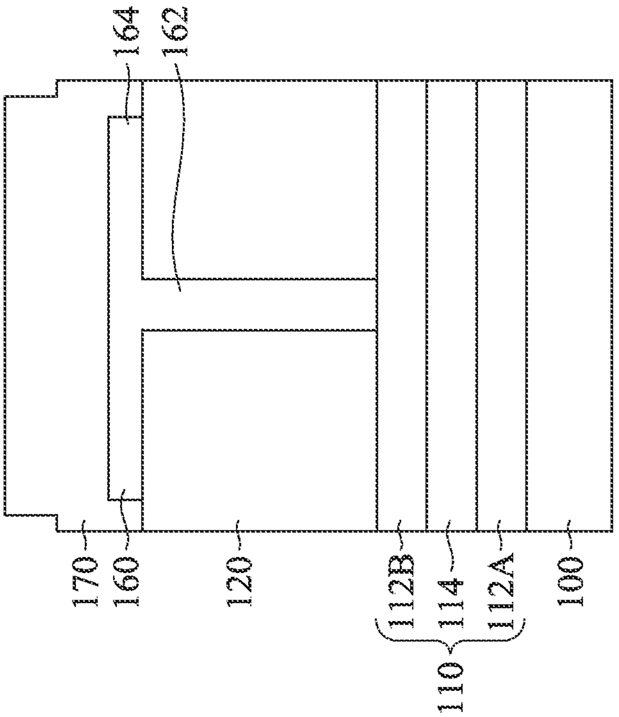

FIG. 8 illustrates a cross-sectional view of a following stage in the CFET structure fabrication. As illustrated in FIG. 8, a dielectric layer 170 is formed over the single-crystalline semiconductor islands 160 by using a suitable deposition technique, such as CVD, ALD, PVD, or the like. In some embodiments, the dielectric layer 170 may include, for example, silicon oxide ($SiO2$) or other suitable dielectric materials.

Figure 9A:
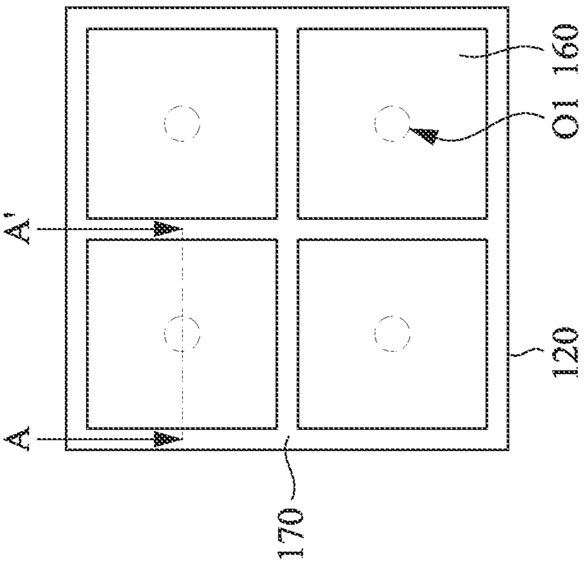
FIGS. 9A and 9B illustrate a top view and a cross-sectional view of an intermediate stage in the CFET structure fabrication, according to some embodiments of the present disclosure.
Figure 9B:
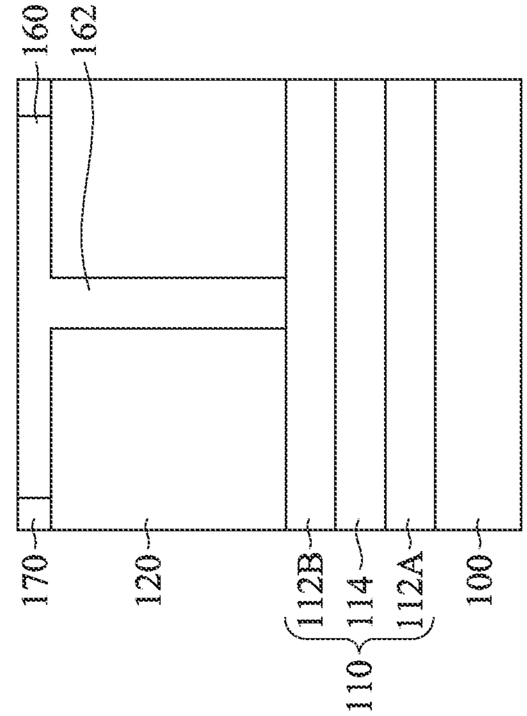

FIGS. 9A and 9B illustrate a top view and a cross-sectional view of a following stage in the CFET structure fabrication, wherein FIG. 9B is a cross-sectional view obtained from cut A-A' in FIG. 9A. As illustrated in FIGS. 9A and 9B, a planarization process (e.g., CMP) is performed on the dielectric layer 170 until the single-crystalline semiconductor islands 160 are exposed. As illustrated in FIG. 9A, after the CMP process is completed, the remaining dielectric layer 170 has a grid top-view pattern that fills trenches among the single-crystalline semiconductor islands 160.

Figure 10A:
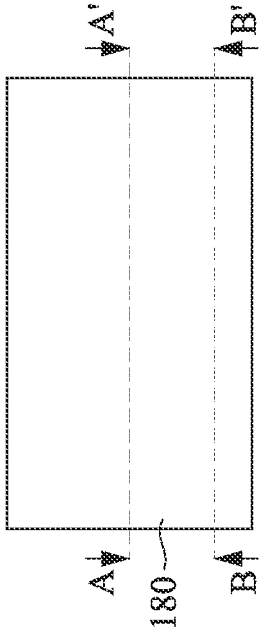
FIGS. 10A-10C illustrate a top view and cross-sectional views of an intermediate stage in the CFET structure fabrication, according to some embodiments of the present disclosure.
Figure 10C:
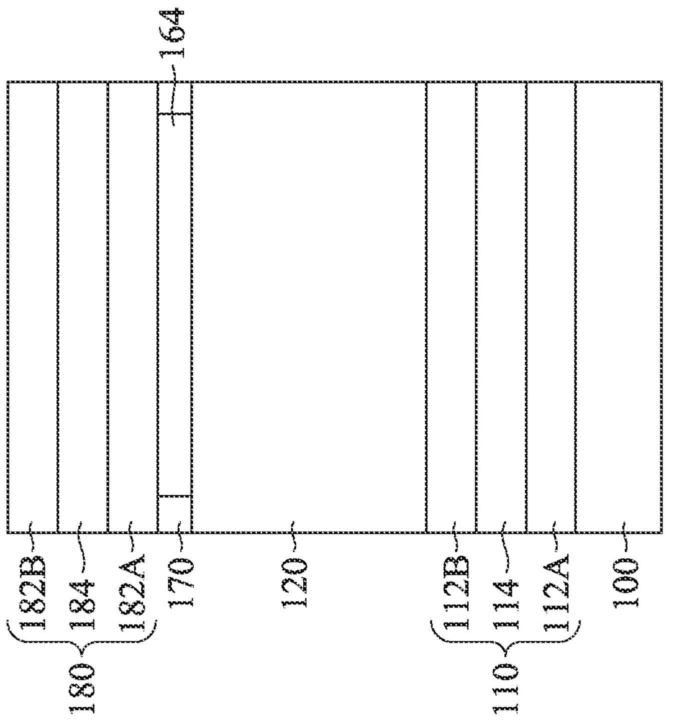
Figure 10B:
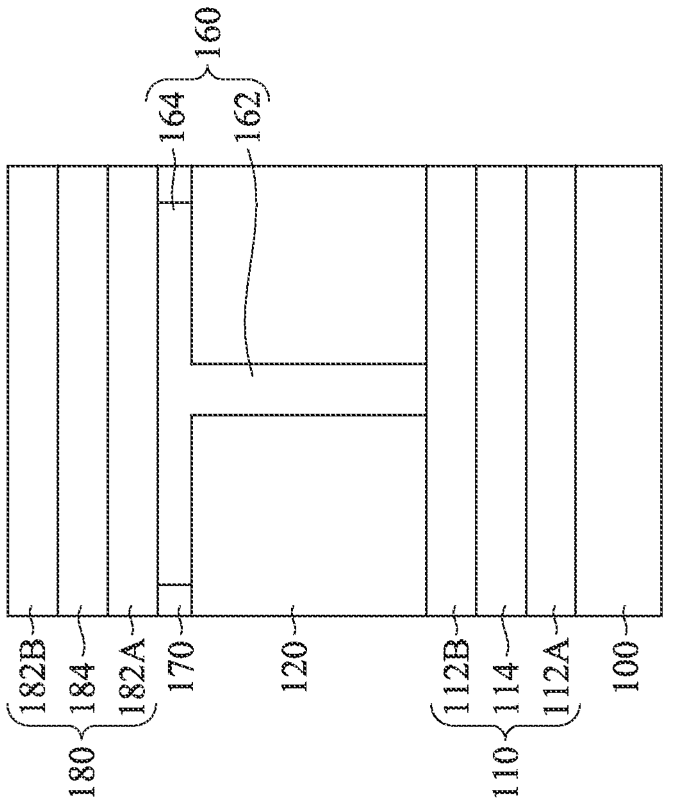

FIGS. 10A, 10B, and 10C illustrate a top view and cross-sectional views of a following stage in the CFET structure fabrication, wherein FIG. 10B is a cross-sectional view obtained from cut A-A' in FIG. 10A, and FIG. 10C is a cross-sectional view obtained from cut B-B' in FIG. 10A. As illustrated in FIGS. 10A-10C, a top-tier epitaxial stack 180 is formed over the single-crystalline semiconductor islands 160. The top-tier epitaxial stack 180 comprises one or more third semiconductor layers 182A-182B (collectively referred to as third semiconductor layers 182) alternating with one or more fourth semiconductor layers 184. The top-tier epitaxial stack 180 is illustrated as including two third semiconductor layers 182 and a fourth semiconductor layer 184 interposing the two third semiconductor layers 182 for illustrative purposes. In some embodiments, the top-tier epitaxial stack 180 may include any number of the third semiconductor layers 182 and the fourth semiconductor layers 184. Each of the layers of the top-tier epitaxial stack 180 may be epitaxially grown using a process such as chemical vapor deposition (CVD), atomic layer deposition (ALD), vapor phase epitaxy (VPE), molecular beam epitaxy (MBE), or the like.

For purposes of illustration and as discussed in greater detail below, portions of the third semiconductor layers 182 will be removed and the fourth semiconductor layers 184 will be patterned to form channel regions of top-tier gate-all-around (GAA) transistors. In some embodiments, the third semiconductor layers 182 are doped with an n-type dopant (e.g., phosphorous) or a p-type dopant (e.g., boron), which will be diffused into source/drain regions of the fourth semiconductor layer 184 in subsequent processing. The third semiconductor layers 182 are thus interchangeably referred to as dopant source layers in some embodiments. The fourth semiconductor layers 184 will become nanosheets, nanowires, nanoslabs or nanorings that include channel regions and source/drain regions formed on opposite sides of channel regions in subsequent processing. The semiconductor layers 184 can be interchangeably referred to as semiconductor active layers providing semiconductor channels, sources, and drains for top-tier transistors.

In some embodiments, the dopant source layers 182 and the semiconductor active layers 184 are made of different materials selected from the group consisting of Si, Ge, Sn, $Si_{1-x}Ge_x$, $Ge_{1-y}Sn_y$, $Si_{1-x-y}Ge_xSn_y$, III-V compound, and combinations thereof. Because of the material difference, in subsequent processing, the dopant source layers 182 can be selectively etched without substantially etching the semiconductor active layers 184.

In some embodiments where the semiconductor active layer 184 serves to form an NFET, the dopant source layers 182 are SiGe doped with an n-type dopant (e.g., phosphorous), and the semiconductor active layer 184 is an un-doped Si layer (e.g., pure silicon layer). The lattice constant difference between Si and SiGe results in a tensile strain/stress on the semiconductor active layer 184, which in turn aids in forming a tensile-strained channel region in the semiconductor active layer 184, which in turn increases electron mobility in the channel region in the semiconductor active layer 184. In some other embodiments, the dopant source layers 112 are Ge layers doped with an n-type dopant (e.g., phosphorous), and the semiconductor active layer 114 is an un-doped SiGe layer. The lattice constant difference between Ge layers and SiGe layer also results in a tensile strain/stress on the semiconductor active layer 184, which in turn aids in forming a tensile-strained channel region in the semiconductor active layer 184, which in turn increases electron mobility in the channel region in the semiconductor active layer 184.

In some embodiments wherein the semiconductor active layer 184 serves to form a PFET, the dopant source layers 182 are SiGe doped with a p-type dopant (e.g., boron), and the semiconductor active layer 184 is an un-doped Si layer. In some other embodiments of a PFET, the dopant source layers 182 are Ge doped with a p-type dopant, and the semiconductor active layer 184 is an un-doped GeSn layer. The lattice constant difference between Ge and GeSn results in a compressive strain/stress on the semiconductor active layer 184, which in turn aids in forming a compressive-strained channel region in the semiconductor active layer 184, which in turn increases hole mobility in the channel region in the semiconductor active layer 184.

In some embodiments, the dopant source layers 182 may have a dopant concentration (e.g., n-type impurity concentration or p-type impurity concentration) greater than about $1\times10^{20}$ atoms/cm$^3$. If the dopant source layers 182 have excessively low dopant concentration (e.g., lower than $1\times10^{21}$ atoms/cm$^3$), then the resultant top-tier transistors will have excessively high source/drain parasitic resistance. In some embodiments, the dopant source layers 182 may be in situ doped with an n-type dopant during epitaxial growth, if the semiconductor active layer 184 serves to form NFETs. In some embodiments, the dopant source layers 182 may be in situ doped with a p-type dopant during epitaxial growth, if the semiconductor active layer 184 serves to form PFETs. In some embodiments, the semiconductor active layer 184 has a thickness in a range from about 0.1 nm to about 100 nm. In some embodiments, the dopant source layers 182 have a thickness in a range from about 0.1 nm to about 100 nm. In some embodiments, the semiconductor active layer 184 is thinner or thicker than the dopant source layers 182. In some embodiments, the semiconductor active layer 184 has a same thickness as the dopant source layers 182.

The dopant source layers 182 of the top-tier epitaxial stack 180 are of a conductivity type opposite a conductivity type of the dopant source layers 112 of the bottom-tier epitaxial stack 110, so that the a transistor formed from the top-tier epitaxial stack 180 is of a conductivity type opposite a conductivity type of a transistor formed from the bottom-tier epitaxial stack 110, which in turn forms a CFET structure. For example, if the bottom-tier dopant source layers 112 are of n-type, then the top-tier dopant source layers 182 are of p-type; if the bottom-tier dopant source layers 112 are of p-type, then the top-tier dopant source layers 182 are of n-type. In some embodiments, the top-tier semiconductor active layer 184 is formed of a different material than the bottom-tier semiconductor active layer 114, because they serve for transistors of opposite conductivity types. In some embodiments, the top-tier semiconductor active layer 184 has a different thickness than the bottom-tier semiconductor active layer 114, because they serve for different transistors. The different in thickness may be tailored to satisfy different performance requirements for different transistors. For example, in some embodiments where the top-tier semiconductor active layer 184 is thicker than the bottom-tier semiconductor active layer 114, the top-tier device may have a higher drive current than the bottom-tier device; and in some embodiments where the bottom-tier semiconductor active layer 114 is thicker than the top-tier semiconductor active layer 184, the bottom-tier device may have a higher drive current than the top-tier device.

Figure 11A:
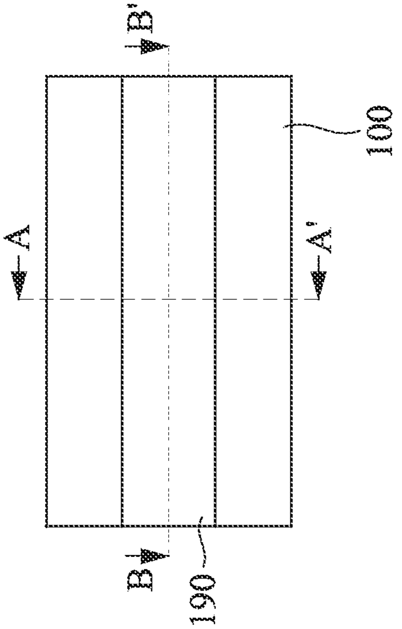
FIGS. 11A-11C illustrate a top view and cross-sectional views of an intermediate stage in the CFET structure fabrication, according to some embodiments of the present disclosure.
Figure 11C:
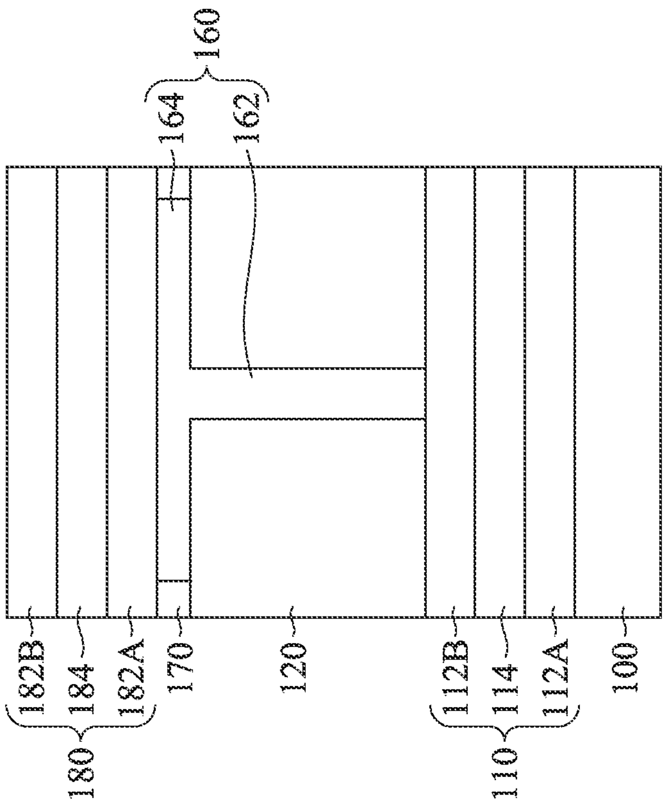
Figure 11B:
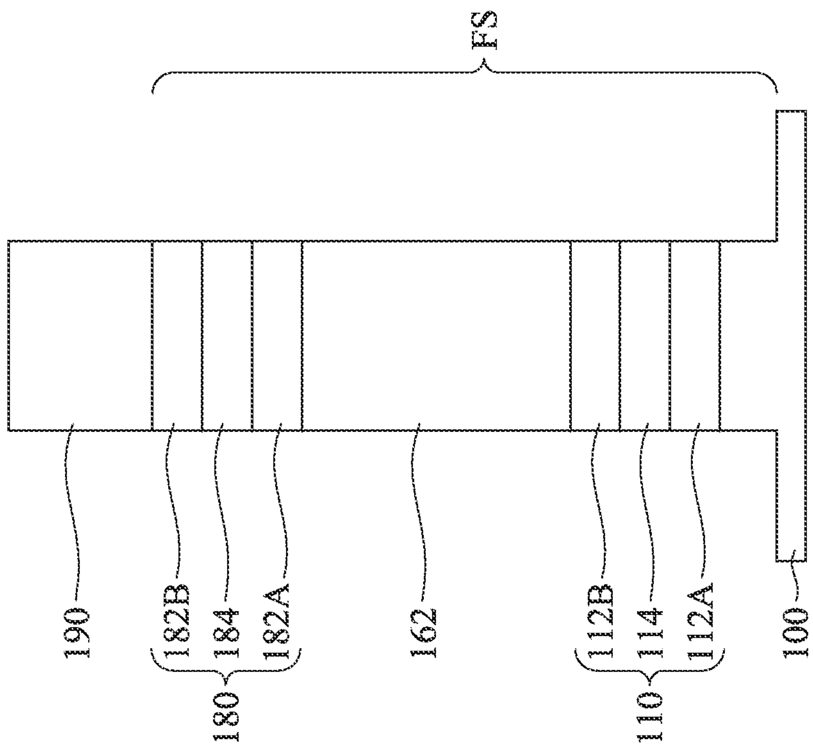

FIGS. 11A, 11B, and 11C illustrate a top view and cross-sectional views of a following stage in the CFET structure fabrication, wherein FIG. 11B is a cross-sectional view obtained from cut A-A' in FIG. 11A, and FIG. 11C is a cross-sectional view obtained from cut B-B' in FIG. 11A. As illustrated in FIGS. 11A-11C, after epitaxial growth of the top-tier epitaxial stack 180 is complete, a hard mask layer is formed over the top-tier epitaxial stack 180 by using suitable deposition techniques, followed by patterning the hard mask layer into a patterned mask 190 by using suitable lithography and etching techniques. With the patterned mask 190 in place, one or more etching processes are performed, by using the patterned mask 190 as an etch mask, to pattern the top-tier epitaxial stack 180, the underlying single-crystalline semiconductor islands 160, the underlying bottom-tier epitaxial stack 110 into one or more fin structures FS protruding from the substrate 100. The one or more etching processes may include wet etching processes, anisotropic dry etching processes, or combinations thereof, and may use one or more etchants that etch the semiconductor materials at a faster etch rate than it etches the patterned mask 190. Although the fin structure FS illustrated in FIG. 11B has vertical sidewalls, the etching process may lead to tapered sidewalls in some other embodiments.

Figure 12A:
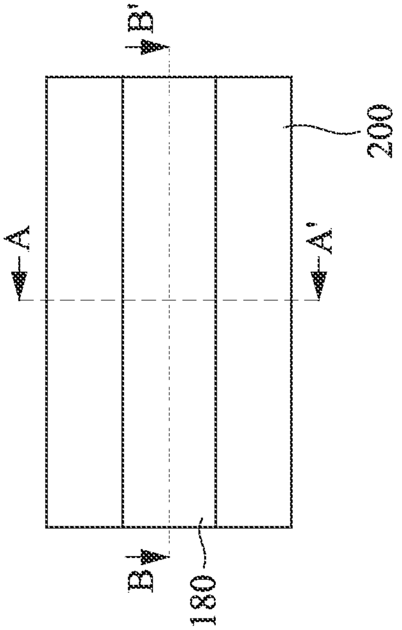
FIGS. 12A-12C illustrate a top view and cross-sectional views of an intermediate stage in the CFET structure fabrication, according to some embodiments of the present disclosure.
Figure 12C:
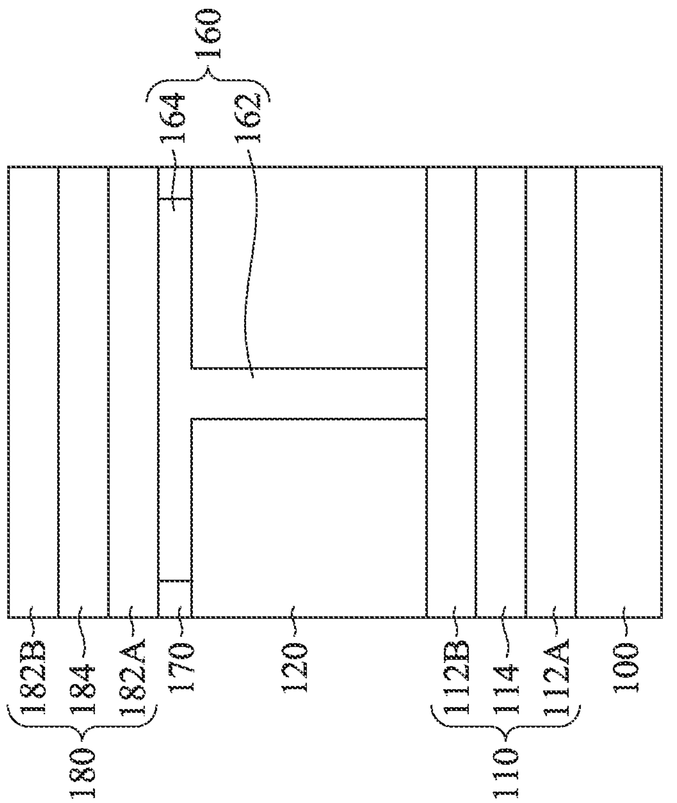
Figure 12B:
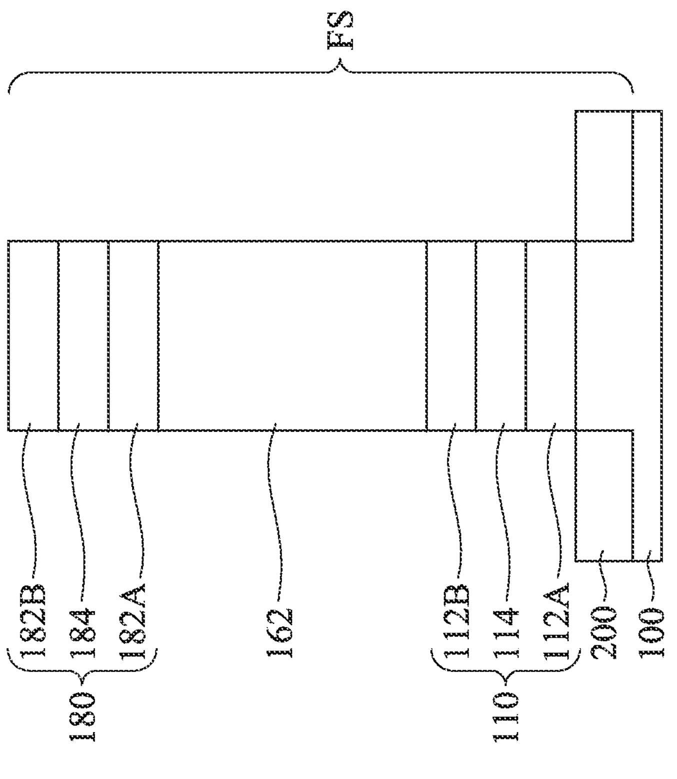

FIGS. 12A, 12B, and 12C illustrate a top view and cross-sectional views of a following stage in the CFET structure fabrication, wherein FIG. 12B is a cross-sectional view obtained from cut A-A' in FIG. 12A, and FIG. 12C is a cross-sectional view obtained from cut B-B' in FIG. 12A. As illustrated in FIGS. 12A-12C, shallow trench isolation (STI) regions 200 (interchangeably referred to as isolation insulation layer) are formed around a lower portion of the fin structure FS. STI regions 200 may be formed by depositing one or more dielectric materials (e.g., silicon oxide) to completely fill the trenches around the fin structures FS and then recessing the top surface of the dielectric materials. The dielectric materials of the STI regions 200 may be deposited using a high density plasma chemical vapor deposition (HDP-CVD), a low-pressure CVD (LPCVD), sub-atmospheric CVD (SACVD), a flowable CVD (FCVD), spin-on coating, and/or the like, or a combination thereof. After the deposition, an anneal process or a curing process may be performed. In some cases, the STI regions 200 may include a liner such as, for example, a thermal oxide liner grown by oxidizing the silicon surface or silicon germanium surface of the fin structure FS and the substrate 100. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI regions 200 such that an upper portion of the fin structure FS protrudes from surrounding insulating STI regions 200. In some embodiments, the patterned hard mask 190 (as illustrated in FIGS. 11A-11C) can be removed in the planarization process and/or the selective etch process.

Figure 13A:
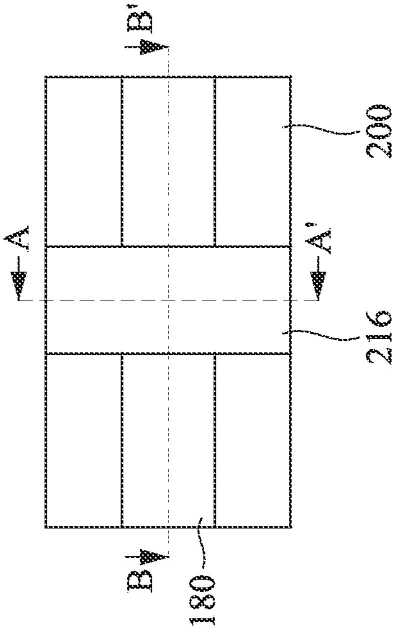
FIGS. 13A-13C illustrate a top view and cross-sectional views of an intermediate stage in the CFET structure fabrication, according to some embodiments of the present disclosure.
Figure 13C:
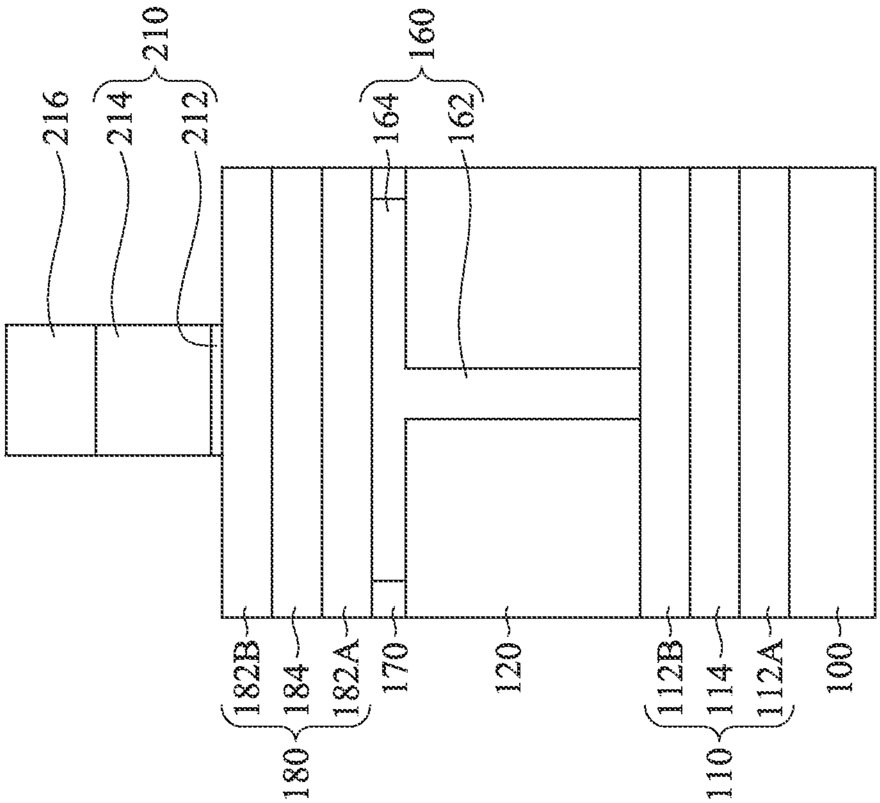
Figure 13B:
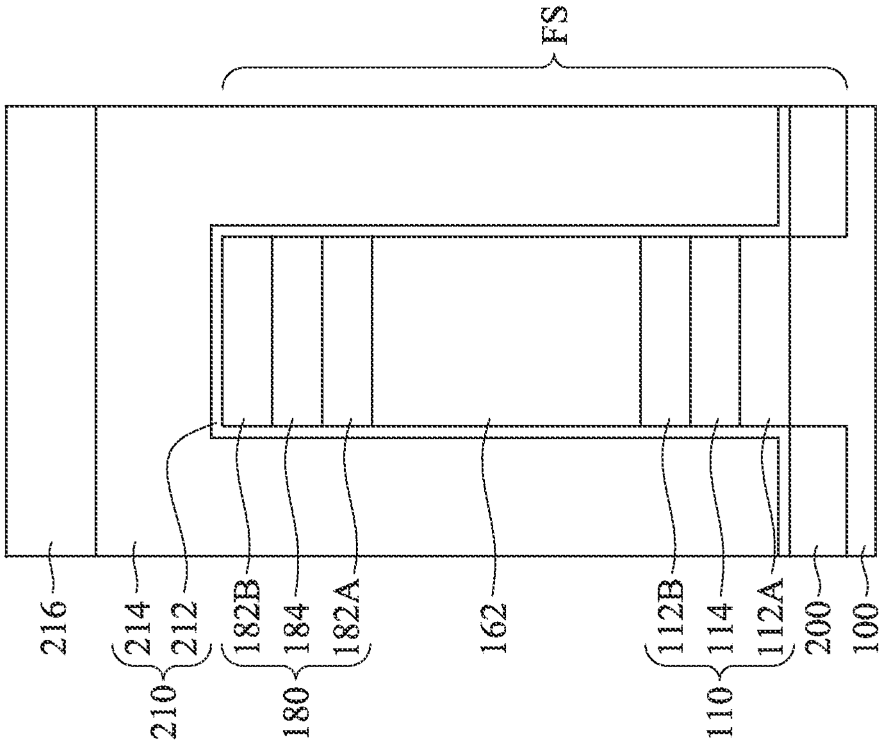

FIGS. 13A, 13B, and 13C illustrate a top view and cross-sectional views of a following stage in the CFET structure fabrication, wherein FIG. 13B is a cross-sectional view obtained from cut A-A' in FIG. 13A, and FIG. 13C is a cross-sectional view obtained from cut B-B' in FIG. 13A. As illustrated in FIGS. 13A-13C, a dummy gate structure 210 is formed across the fin structure FS. As illustrated in the top view of FIG. 13A, the dummy gate structure 210 has a longitudinal axis perpendicular to a longitudinal axis of the fin structure FS. In some embodiments, the dummy gate structure 210 includes a dummy gate dielectric layer 212 and a dummy gate 214 over the dummy gate dielectric layer 212. In some embodiments, the dummy gate dielectric layer 212 may be, for example, silicon oxide, silicon nitride, a combination thereof, or the like, and may be deposited or thermally grown according to acceptable techniques. The dummy gate 214 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals.

The dummy gate structure 210 is formed by, for example, depositing a layer of dummy gate dielectric material and a layer of dummy gate material over the fin structure FS, forming a patterned mask 216 over the layer of dummy gate material, followed by patterning the layer of dummy gate material and the layer of gate dielectric material into one or more dummy gate structures 210 by one or more etching processes using the patterned mask 216 as an etch mask. In some embodiments, the patterned mask 216 includes, for example, silicon oxide ($SiO_2$) or other suitable dielectric materials.

Figure 14A:
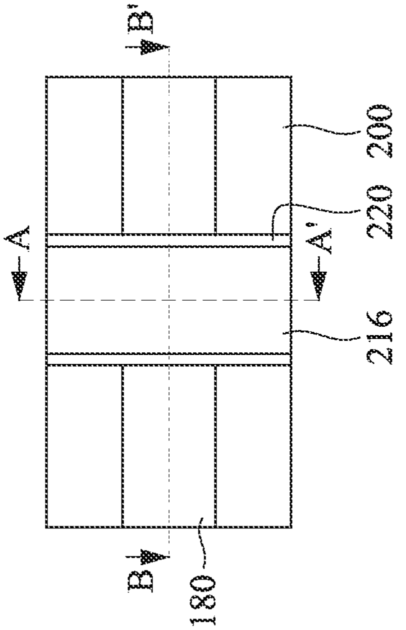
FIGS. 14A-14C illustrate a top view and cross-sectional views of an intermediate stage in the CFET structure fabrication, according to some embodiments of the present disclosure.
Figure 14B:
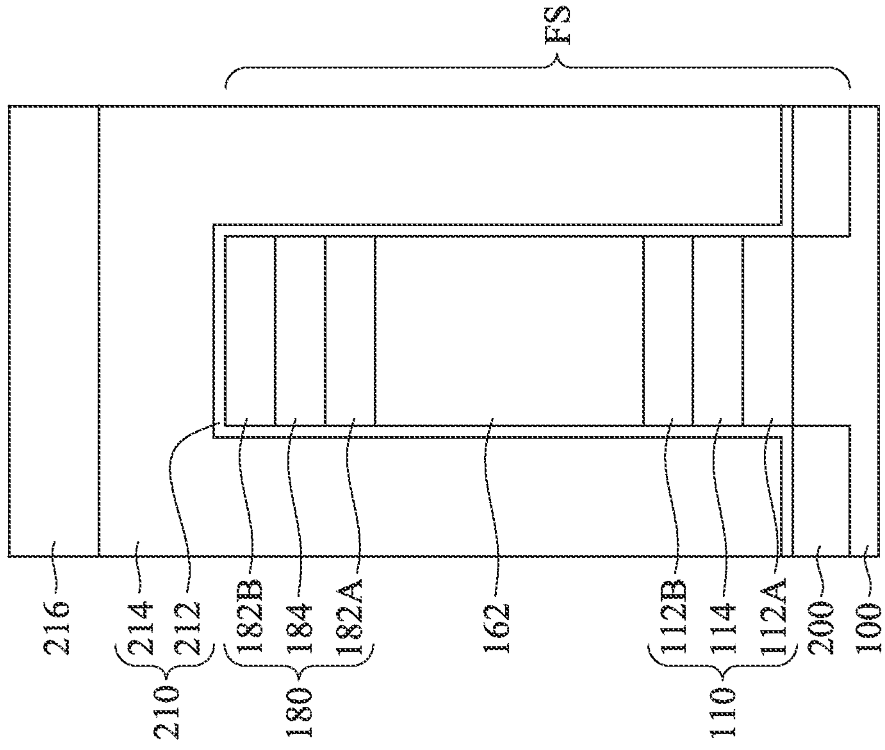
Figure 14C:
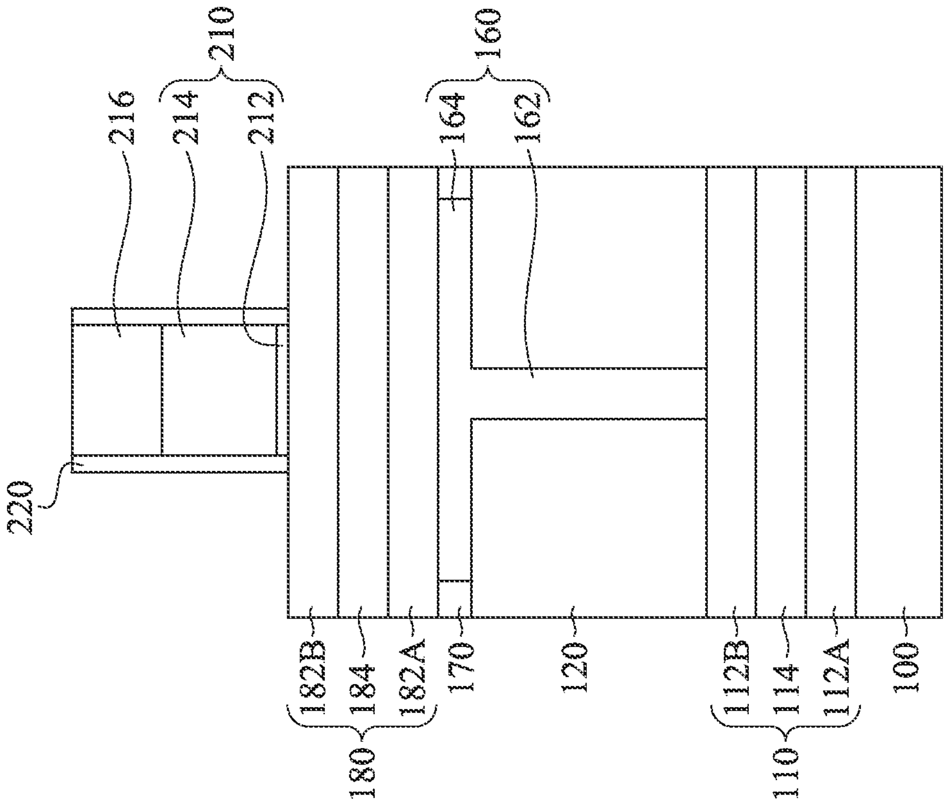

FIGS. 14A, 14B, and 14C illustrate a top view and cross-sectional views of a following stage in the CFET structure fabrication, wherein FIG. 14B is a cross-sectional view obtained from cut A-A' in FIG. 14A, and FIG. 14C is a cross-sectional view obtained from cut B-B' in FIG. 14A. As illustrated in FIGS. 14A-14C, gate spacers 220 are formed on sidewalls of the dummy gate structure 210. In some embodiments of the spacer formation step, a spacer material layer is deposited on the substrate 100. The spacer material layer may be a conformal layer that is subsequently etched back to form gate sidewall spacers. In the illustrated embodiment, a spacer material layer is disposed conformally on top and sidewalls of the dummy gate structure 210. The spacer material layer may include a dielectric material such as silicon oxide, silicon nitride, silicon carbide, silicon oxynitride, SiCN films, silicon oxycarbide, SiOCN films, and/or combinations thereof. The spacer material layer may be formed by depositing a dielectric material over the dummy gate structure 210 using processes such as, CVD process, a subatmospheric CVD (SACVD) process, a flowable CVD process, an ALD process, a PVD process, or other suitable process. An anisotropic etching process is then performed on the deposited spacer material layer to expose portions of the fin structure FS not covered by the dummy gate structure 210. Portions of the spacer material layer directly above the dummy gate structure 210 may be completely removed by this anisotropic etching process. Portions of the spacer material layer on sidewalls of the dummy gate structure 210 may remain, forming gate sidewall spacers, which are denoted as the gate spacers 220, for the sake of simplicity.

Figure 15A:
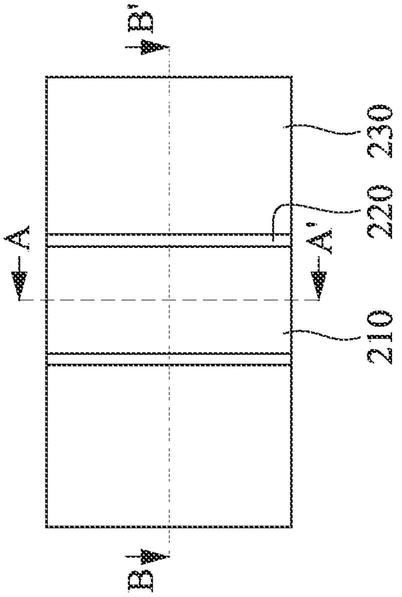
FIGS. 15A-15C illustrate a top view and cross-sectional views of an intermediate stage in the CFET structure fabrication, according to some embodiments of the present disclosure.
Figure 15B:
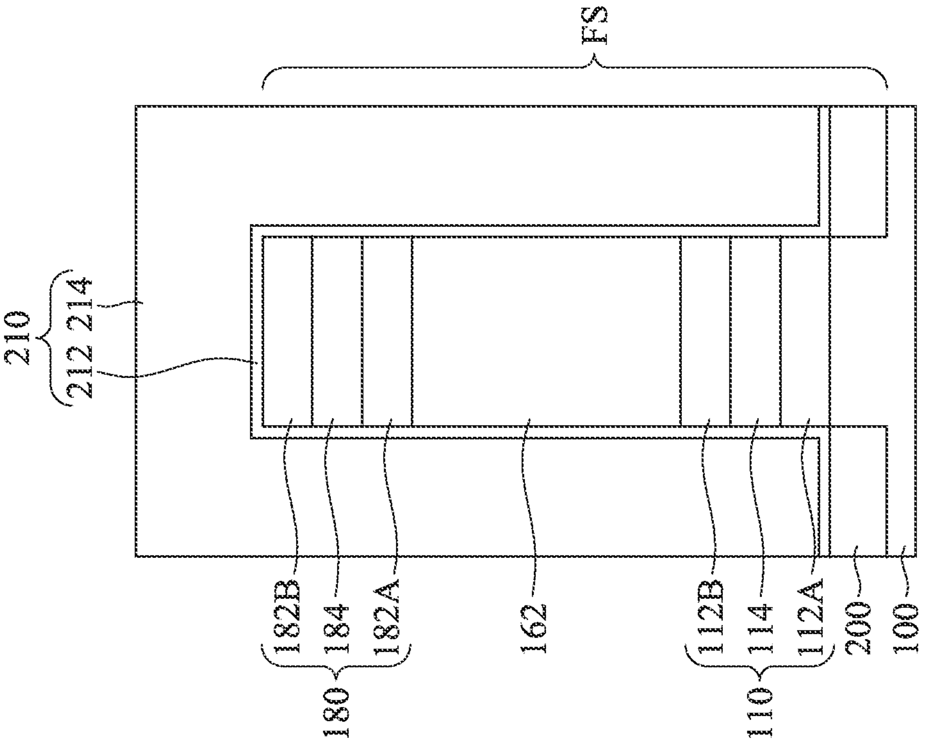
Figure 15C:
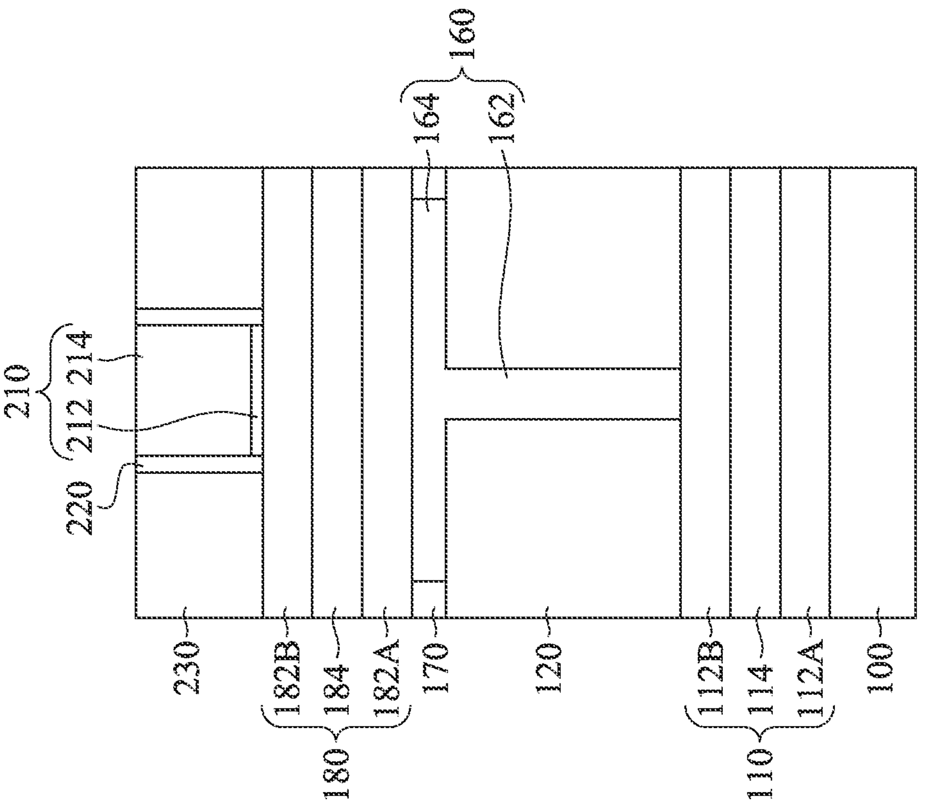

FIGS. 15A, 15B, and 15C illustrate a top view and cross-sectional views of a following stage in the CFET structure fabrication, wherein FIG. 15B is a cross-sectional view obtained from cut A-A' in FIG. 15A, and FIG. 15C is a cross-sectional view obtained from cut B-B' in FIG. 15A. As illustrated in FIGS. 15A-15C, an interlayer dielectric (ILD) layer 230 is formed over the dummy gate structure 210 by using suitable deposition techniques, followed by performing a planarization process (e.g., CMP) on the ILD layer 230 until the dummy gate 214 is exposed. The patterned mask 216 is thus removed by the planarization process. In some embodiments, the ILD layer 230 may be deposited by any suitable method, such as CVD, plasma-enhanced CVD (PECVD), or FCVD. Dielectric material(s) of the ILD layer 230 may include phospho-silicate glass (PSG), boro-silicate glass (BSG), boron-doped phospho-silicate glass (BPSG), undoped silicate glass (USG), or the like. Other insulation materials formed by any acceptable process may be used. Then, a planarization process, such as a CMP, may be performed to level the top surface of the ILD layer 230 with the top surface of the dummy gate 214.

Figure 16A:
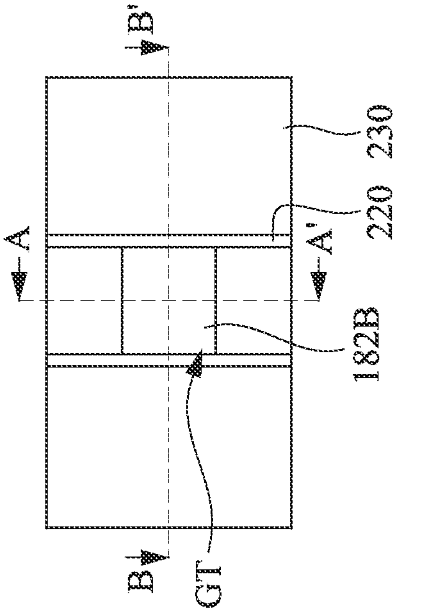
FIGS. 16A-16C illustrate a top view and cross-sectional views of an intermediate stage in the CFET structure fabrication, according to some embodiments of the present disclosure.
Figure 16C:
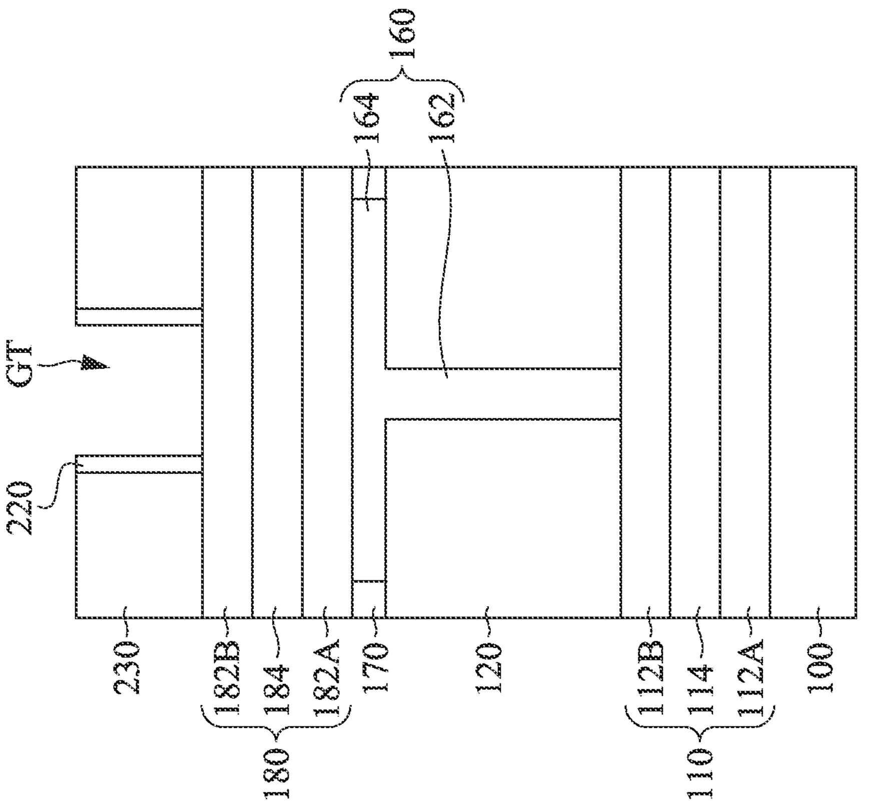
Figure 16B:
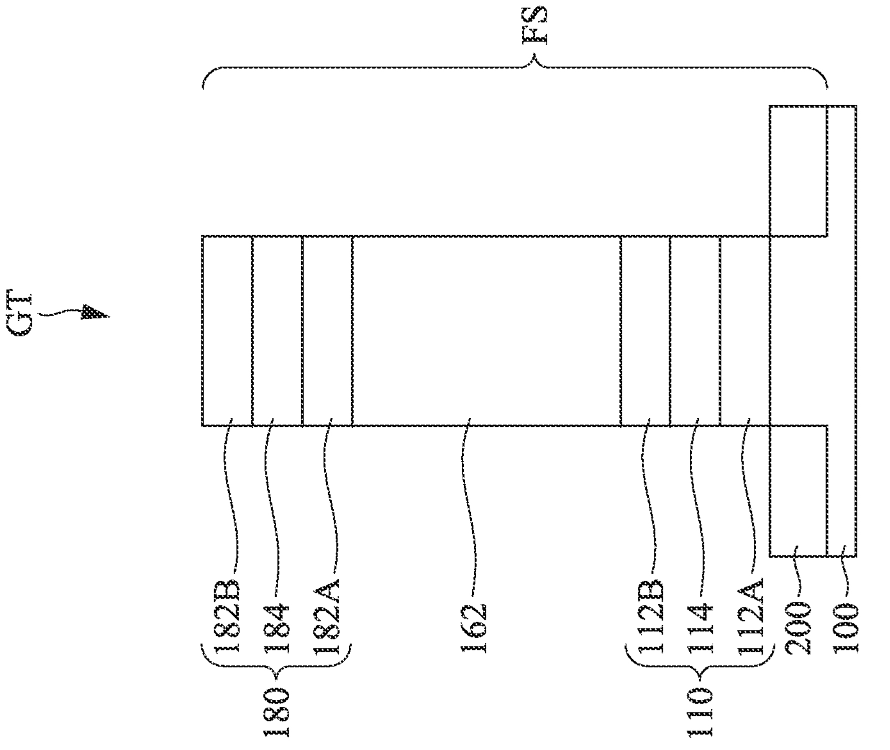

FIGS. 16A, 16B, and 16C illustrate a top view and cross-sectional views of a following stage in the CFET structure fabrication, wherein FIG. 16B is a cross-sectional view obtained from cut A-A' in FIG. 16A, and FIG. 16C is a cross-sectional view obtained from cut B-B' in FIG. 16A. As illustrated in FIGS. 16A-16C, the dummy gate structure 210 is removed in one or more etching steps, so that a gate trench GT is formed between corresponding gate spacers 220. In some embodiments, the dummy gate dielectric layer 212 in the gate trench GT are also be removed. In some embodiments, the dummy gate 214 and the dummy gate dielectric layer 212 are removed by an anisotropic dry etch process. For example, the etching process may include a dry etch process using reaction gas(es) that selectively etch the dummy gate 214 at a faster etch rate than etching the gate spacers 220. Each gate trench GT exposes and/or overlies portions of the semiconductor active layers 114 and 184, which will serve as channel regions in subsequently completed transistors. During the removal, the dummy gate dielectric layer 212 may be used as etch stop layers when the dummy gate 214 is etched. The dummy gate dielectric layers 212 may then be removed after the removal of the dummy gate 214.

Figure 17B:
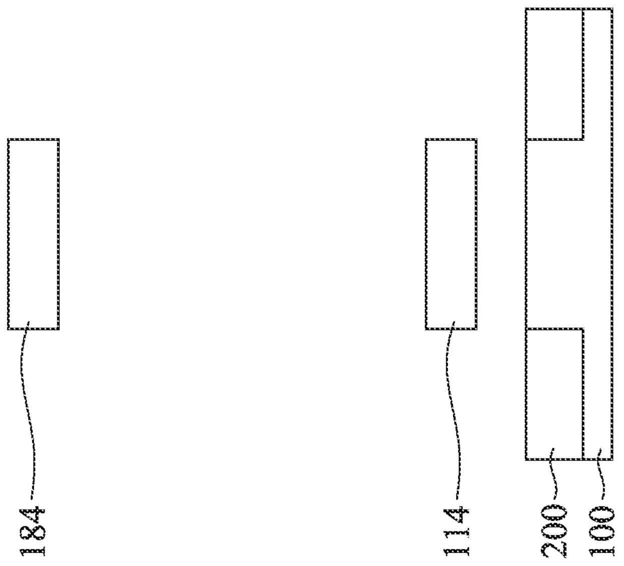
FIGS. 17A-17C illustrate a top view and cross-sectional views of an intermediate stage in the CFET structure fabrication, according to some embodiments of the present disclosure.
Figure 17A:
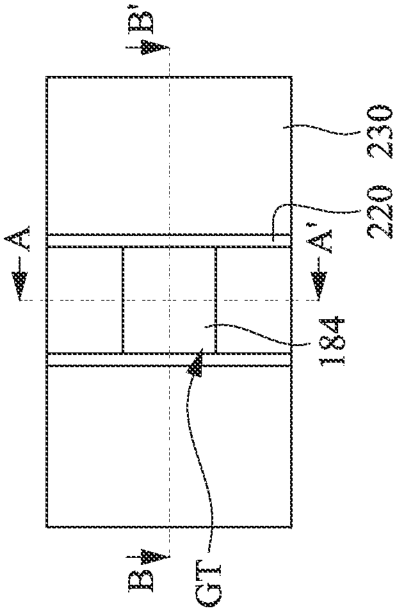
Figure 17C:
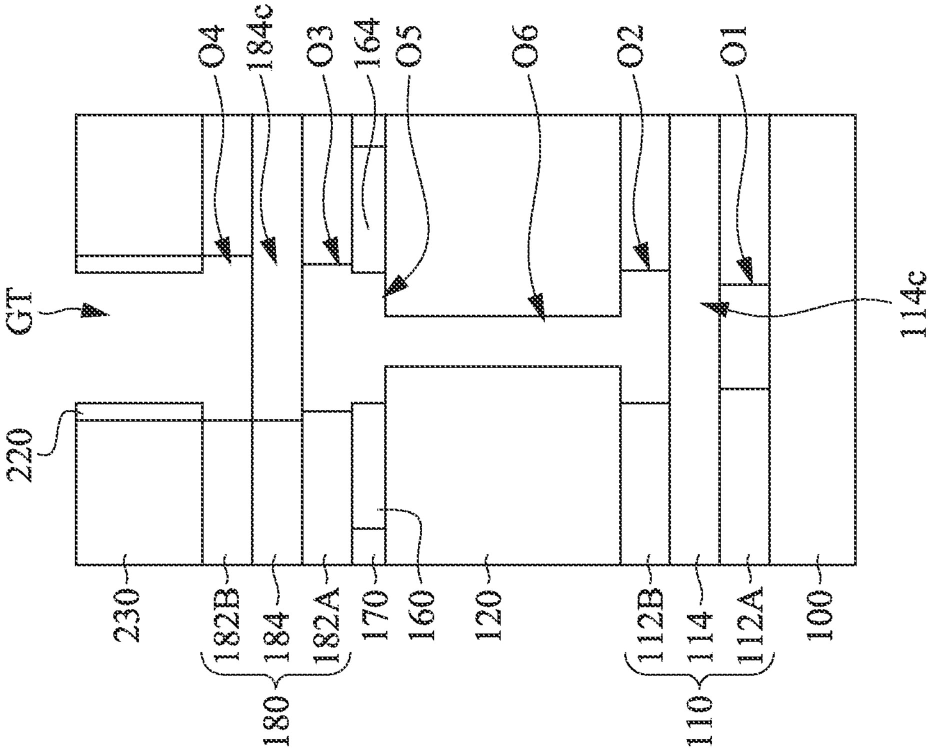
Figure 17D:
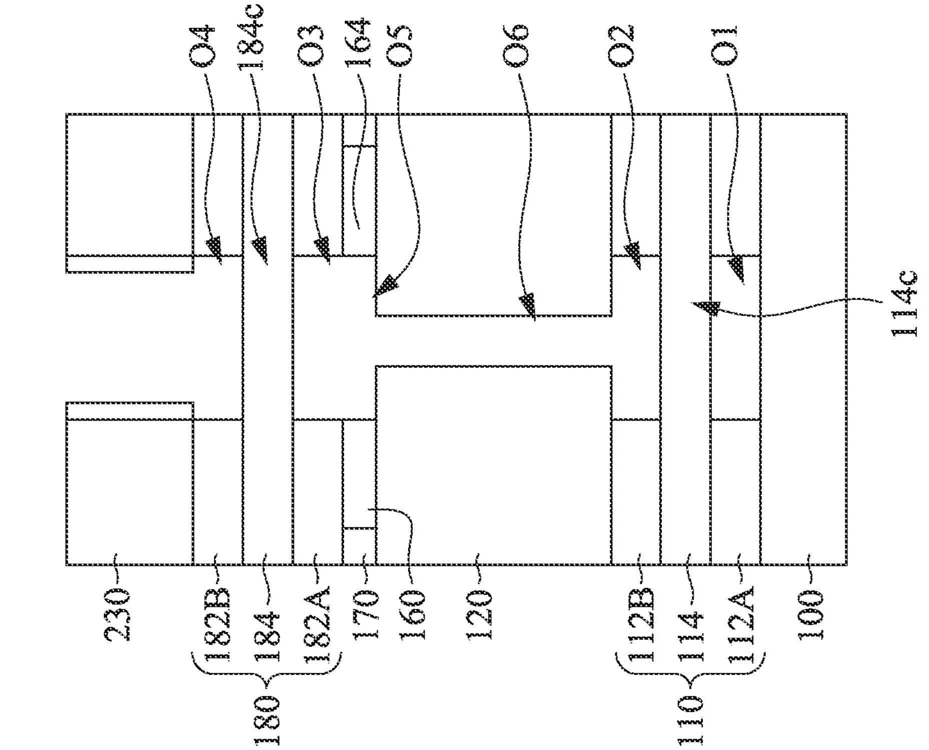
FIG. 17D illustrates a cross-sectional view of an intermediate stage in the CFET structure fabrication, according to some other embodiments of the present disclosure.

FIGS. 17A, 17B, and 17C illustrate a top view and cross-sectional views of a following stage in the CFET structure fabrication, wherein FIG. 17B is a cross-sectional view obtained from cut A-A' in FIG. 17A, and FIG. 17C is a cross-sectional view obtained from cut B-B' in FIG. 17A. As illustrated in FIGS. 17A-17C, portions of the bottom-tier dopant source layers 112A and portions of the top-tier dopant source layers 182A exposed by the gate trench GT are removed by, for example, an isotropic etching process such as wet etching or the like using etchants which are selective to the materials of the dopant source layers 112 and 182. Stated differently, exposed portions of the dopant source layers 112 and 182 are removed by using a selective etching process that etches the dopant source layers 112 and 182 at a faster etch rate than it etches the semiconductor active layers 114 and 184, thus forming empty space around a channel region 114*c* of the semiconductor active layer 114 and a channel region 184*c* of the semiconductor active layer 184. This step can be referred to as a channel release process.

At this interim processing step, the space around the bottom-tier channel region 114*c* and top-tier channel region 184*c* may be filled with ambient environment conditions (e.g., air, nitrogen, etc). In some embodiments, the channel regions 114*c*, 184*c* can be referred to as nanosheets, nanowires, nanoslabs, nanorings having nano-scale size (e.g., a few nanometers), depending on their geometry. For example, in some embodiments the channel regions 114*c*, 184*c* may be trimmed to have a substantial rounded shape (i.e., cylindrical) due to the selective etching process for completely removing exposed portions of the dopant source layers 112, 182. In that case, the resultant channel layers 114*c*, 184*c* can be called nanowires.

In embodiments in which the dopant source layers 112 and 182 include SiGe, and the semiconductor active layers 114 and 184 include Si, the exposed portions of the dopant source layers 112 and 182 can be removed by wet etching using a wet etching solution comprising an etching chemical such as $H_2O_2$ and/or $HNO_3$. The wet etching may result in different etching amount at different layers, because of dopant species difference between different layers. For example, as illustrated in FIG. 17C, the wet etching process forms openings O1, O2, O3, O4, and O5 with different widths in the dopant source layers 112A, 112B, 182A, and 182B, and the single-crystalline semiconductor lateral portion 164, respectively. In some embodiments where the dopant source layers 112 are of n-type and the dopant source layers 182 are of p-type, the openings O1 and O2 in the n-type doped layers 112 have a smaller width than the opening O3, O4 in the p-type doped layers 182. Moreover, the opening O5 in the un-doped layer 164 has a width smaller than the widths of the openings O3 and O4 in the p-type doped layers 182 and larger than the widths of the openings O1 and O2 in the n-type doped layers 112. In some embodiments, the opening O4 may have a larger width than the opening O3, because of different p-type dopant concentrations between the p-type doped layers 182A and 182B. In some embodiments, the opening O2 may have a larger width than the opening O1, because of different n-type dopant concentrations between the n-type doped layers 112A and 112B.

In embodiments in which the dopant source layers 112 and 182 include SiGe, and the semiconductor active layers 114 and 184 include Si, the exposed portions of the dopant source layers 112 and 182 can be removed by a selective isotropic dry etching process. An example selective dry etching process uses $NF_3$ gas as a main etchant, wherein the $NF_3$ gas is provided at a flow rate in the range from about 10 standard cubic centimeters per minute (sccm) to about 20 sccm (e.g., about 17 sccm), at a temperature in a rage from about 10 degrees Centigrade to about 20 degrees Centigrade (e.g., about 14 degrees Centigrade), at a pressure in a range from about 5 Torr to about 10 Torr (e.g., about 7 Torr). The dry etch reactant can be pumped into a processing chamber where the substrate 100 is placed. The dry etch reactant is pumped into the processing chamber from sidewalls and a top region of the chamber to reduce the etching amount difference among layers 112A, 112B, 182A, 182B at different level heights. As a result, the dry etching conditions can be controlled in such a way that openings O1, O2, O3, O4, and O5 in the respective layers 112A, 112B, 182A, 182B, and 164 have substantially same width, as illustrated in the embodiment shown in FIG. 17D.

In some embodiments as illustrated in FIG. 17C, the channel release process also removes the single-crystalline semiconductor plug 162, resulting in an opening O6 extending through the inter-tier dielectric layer 120. The opening O6 in the inter-tier dielectric layer 120 has a smaller width than the openings O1, O2, O3, O4, and O5, because the inter-tier dielectric layer 120 has no or negligible etching amount in the selective etching process.

Figure 18A:
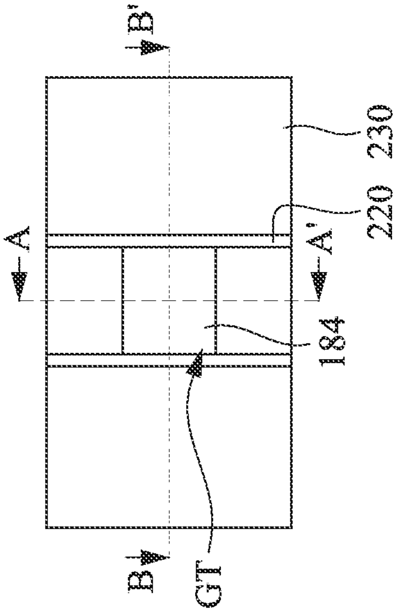
FIGS. 18A-18C illustrate a top view and cross-sectional views of an intermediate stage in the CFET structure fabrication, according to some embodiments of the present disclosure.
Figure 18C:
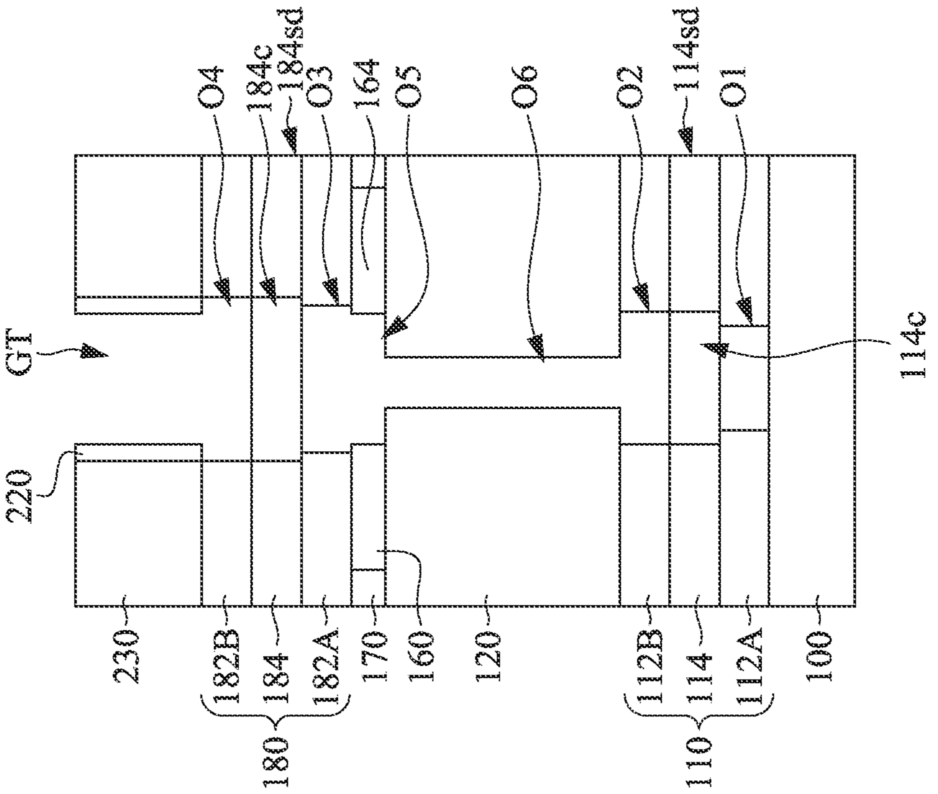
Figure 18B:
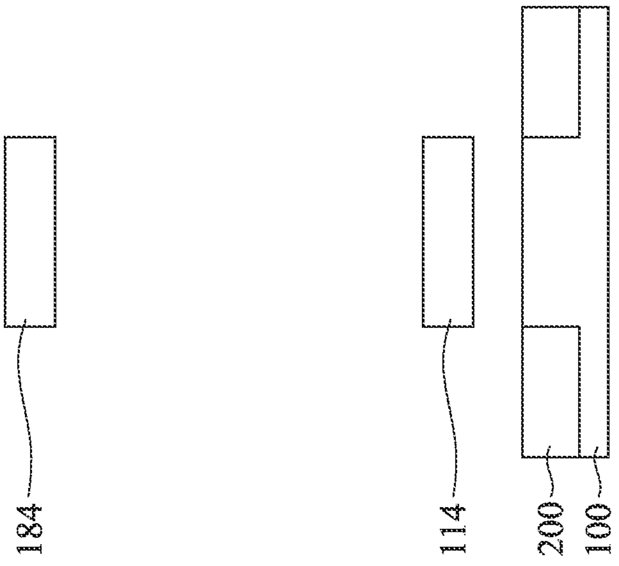

FIGS. 18A, 18B, and 18C illustrate a top view and cross-sectional views of a following stage in the CFET structure fabrication, wherein FIG. 18B is a cross-sectional view obtained from cut A-A' in FIG. 18A, and FIG. 18C is a cross-sectional view obtained from cut B-B' in FIG. 18A. As illustrated in FIGS. 18A-18C, an anneal process is performed to diffuse a first type dopant or impurity from the bottom-tier dopant source layers 112 into source/drain regions 114*sd* of the bottom-tier semiconductor active layer 114, and to diffuse a second type dopant or impurity from the top-tier dopant source layers 182 into source/drain regions 184*sd* of the top-tier semiconductor active layer 184. In some embodiments, the first type dopant is an n-type dopant (e.g., phosphorous), and the second type dopant is a p-type dopant (e.g., boron). Alternatively, the first type dopant is a p-type dopant, and the second type dopant is an n-type dopant.

The annealing process may be, for example, a rapid thermal anneal (RTA) or the like. The annealing process heats the dopant source layers 112 and 182 to a peak temperature higher than or equal to about 800 degrees Centigrade, which is high enough to trigger diffusion for both phosphorus and boron. The annealing process not only drives dopant diffusion, but also activates the first type dopant in the bottom-tier source/drain regions 114*sd* and the second type dopant in the top-tier source/drain regions 184*sd*. In some embodiments, after the annealing process is complete, the bottom-tier source/drain regions 114*sd* has a first-type dopant concentration in a range from about $1\times10^{10}$ atoms/$cm^3$ to about $1\times10^{15}$ atoms/$cm^3$. If the first-type dopant concentration is out of this range, the resultant bottom-tier transistor may suffer degraded carrier mobility and/or degraded reliability due to impurity scattering and random fluctuation. In some embodiments, after the annealing process is complete, the top-tier source/drain regions 184*sd* has a second-type dopant concentration in a range from about $1\times10^{10}$ atoms/$cm^3$ to about $1\times10^{15}$ atoms/$cm^3$. If the second-type dopant concentration is out of this range, the resultant top-tier transistor may suffer degraded carrier mobility and/or degraded reliability due to impurity scattering and random fluctuation.

Figure 19A:
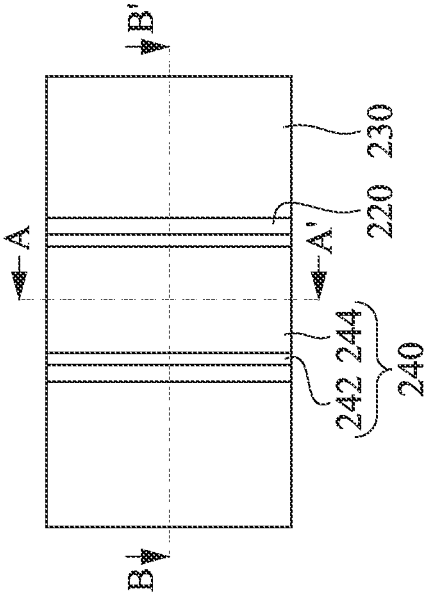
FIGS. 19A-19C illustrate a top view and cross-sectional views of an intermediate stage in the CFET structure fabrication, according to some embodiments of the present disclosure.
Figure 19C:
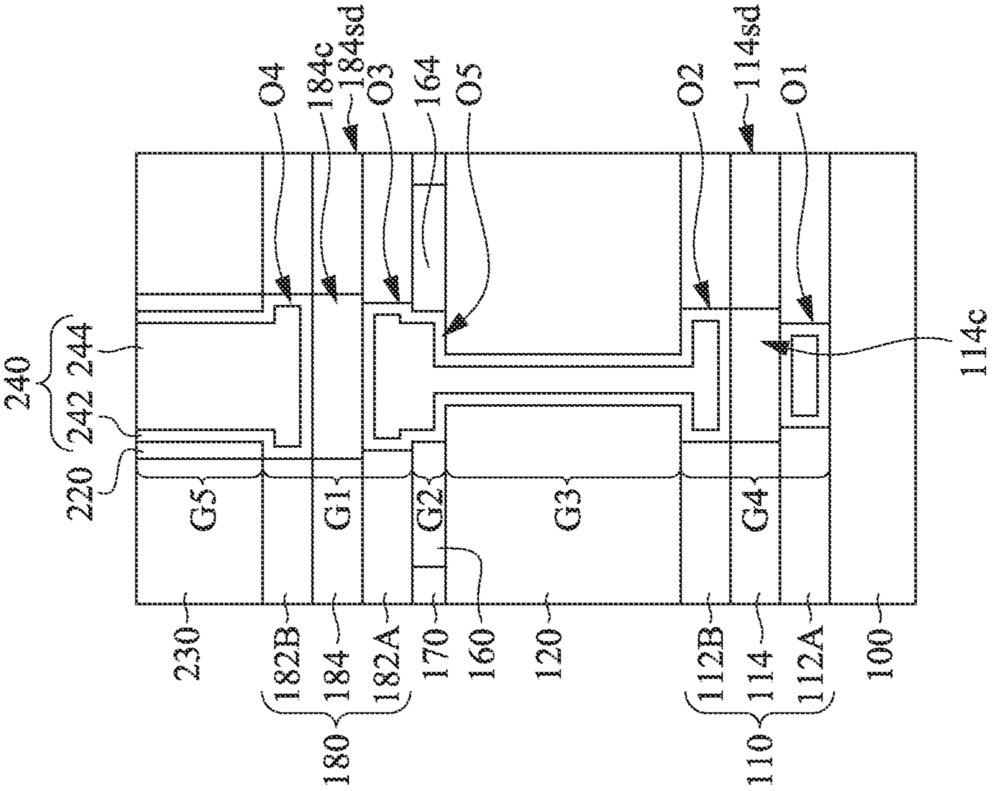
Figure 19B:
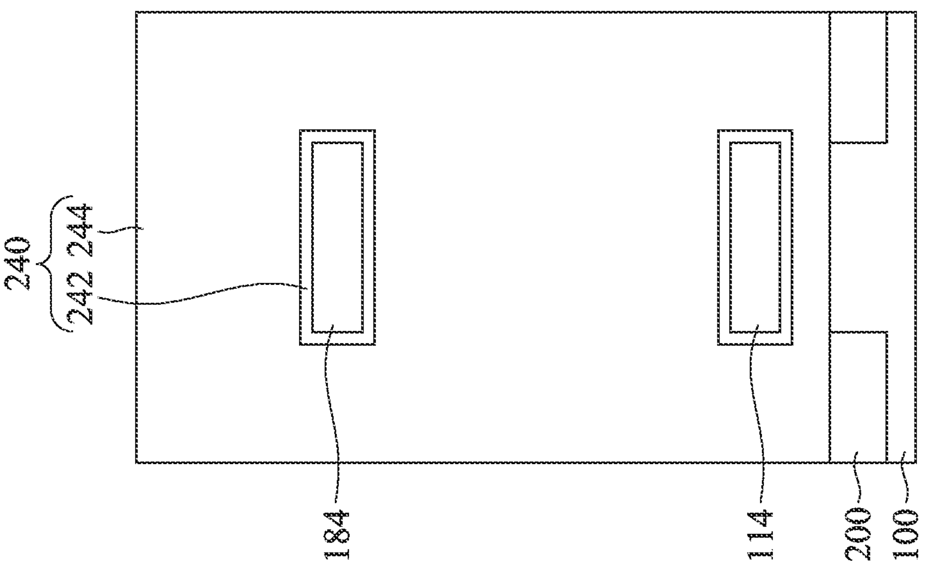

FIGS. 19A, 19B, and 19C illustrate a top view and cross-sectional views of a following stage in the CFET structure fabrication, wherein FIG. 19B is a cross-sectional view obtained from cut A-A' in FIG. 19A, and FIG. 19C is a cross-sectional view obtained from cut B-B' in FIG. 19A. As illustrated in FIGS. 19A-19C, a replacement gate structure 240 is formed in the gate trench GT to surround each of the channel regions 114*c*, 184*c* suspended in the gate trench GT. The final gate structure may be a high-k/metal gate stack, however other compositions are possible. The gate structure 240 may be a final gate shared by the bottom-tier transistor and the top-tier transistor. In particular, the gate structure 240 forms a gate surrounding the bottom-tier channel region 114*c*, and also forms a gate surrounding the top-tier channel region 184*c*. For example, the high-k/metal gate structure 240 is formed within the openings O1, O2. O3, O4, O5 and O6 provided by the channel release process, and thus the high-k/metal gate structure 240 serves as a gate that forms a bottom-tier transistor with the bottom-tier channel region 114*c* and bottom-tier source/drain regions 114*sd*, and also serve as a gate that forms a top-tier transistor with the top-tier channel region 184*c* and top-tier source/drain regions 184*sd*. Because the bottom-tier source/drain regions 114*sd* are of a conductivity type opposite a conductivity type of the top-tier source/drain regions 184*sd*, the bottom-tier transistor and the top-tier transistor are of opposite conductivity types and thus form a CFET.

In various embodiments, the high-k/metal gate structure 240 includes a gate dielectric layer 242 surrounding the bottom-tier channel region 114*c* and the top-tier channel region 184*c*, and a gate metal layer 244 surrounding the gate dielectric layer 242 and filling a remainder of the gate trench GT. Formation of the high-k/metal gate structures 240 may include one or more deposition processes to form various materials of the gate dielectric layer 242 and gate metal layer 244, followed by a CMP process to remove excessive materials, resulting in the high-k/metal gate structure 240 having a top surface level with top surfaces of gate spacers 220 and top surfaces of the ILD layer 230.

In some embodiments, the gate dielectric layer 242 includes an interfacial layer and a high-k dielectric layer over the interfacial layer. In some embodiments, the interfacial layer is silicon oxide formed on exposed surfaces of semiconductor materials in the gate trench GT by using, for example, thermal oxidation, chemical oxidation, wet oxidation or the like. As a result, horizontal surfaces of the channel regions 114*c*, 184*c* and sidewalls of the dopant source layers 112, 182 exposed in the gate trench GT may be oxidized into silicon oxide to form an interfacial layer. The high-k gate dielectric layer has a dielectric constant greater than a dielectric constant of silicon oxide. For example, the high-k gate dielectric layer includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate dielectric layer 242 includes silicon oxide ($SiO_2$) with a dielectric constant (i.e., k value) of about 3.9, silicon carbonitride (SiCN) with a dielectric constant of about 4.9, silicon nitride ($Si_3N_4$) with a dielectric constant of about 7.1, aluminum oxide ($Al_2O_3$) with a dielectric constant of about 9, hafnium oxide ($HfO_2$) with a dielectric constant of about 20, zirconium oxide ($ZrO_2$) with a dielectric constant of about 40, titanium oxide ($TiO_2$) with a dielectric constant of about 95, tantalum oxide ($Ta_2O_5$) with a dielectric constant of about 26, hafnium zirconium oxide (HZO) with a dielectric constant of about 20 to about 45, lead zirconate titanate (PZT) with a dielectric constant of about 1400 to about 1800, yttrium oxide ($Y_2O_3$) with a dielectric constant of about 14 to about 18, poly [(vinylidenefluoride-co-trifluoroethylene)] (P(VDF/TrFE)) with a dielectric constant of about 14-18, and/or barium titanium oxide ($BaTiO_3$) with a dielectric constant greater than about 200.

In some embodiments, the gate metal layer 244 includes one or more metal layers. For example, the gate metal layer 244 may include one or more work function metal layers stacked one over another and a fill metal filling up a remainder of the gate trench GT. The one or more work function metal layers in the gate metal layer 244 provide a suitable work function for the high-k/metal gate structure 240. For an n-type GAA FET, the gate metal layer 244 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the gate metal layer 244 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 244 may exemplarily include, but are not limited to, Pt, Ti, TiN, Al, W, WN, Ru, RuO, Ta, Ni, Co, Cu, Ag, Au, or other suitable materials.

In some embodiments, an upper portion of the gate metal layer 244 within the top-tier epitaxial stack 180 has a different work function metal composition than a lower portion of the gate metal layer 244 within the bottom-tier epitaxial stack 110, so that the work function metals serving form NFFT and PFET can be different. For example, after forming an initial gate metal layer 244 in the gate trench, an upper portion of the initial gate metal layer can be replaced with another gate metal layer having a different work function metal composition than the initial gate metal layer, by using suitable etching and deposition techniques.

As illustrated in FIG. 19C, the gate structure 240 includes a first portion G4 within the bottom-tier epitaxial stack 110 and a second portion G1 within the top-tier epitaxial stack 180. In some embodiments, the first portion G4 has a width smaller than the second portion G1, because the openings O1, O2 in the bottom-tier epitaxial stack 110 have a smaller width than the openings O3 and O4 in the top-tier epitaxial stack 180. Moreover, the gate structure 240 further includes a third portion G2 within the single-crystalline island 160 and a fourth portion G3 within the inter-tier dielectric layer 120. The third portion G2 has a width smaller than the width of the second portion G1 and larger than the width of the first portion G4, because the opening O5 in the single-crystalline island 160 has a width smaller than the widths of the openings O3, O4 in the top-tier epitaxial stack 180 and larger than the width of the openings O1, O2 in the bottom-tier epitaxial stack 110. The fourth portion G3 has a smaller width than the first, second, and third portions, because the opening O6 has a smaller width than the openings O1, O2, O3, O4, and O5. The gate structure 240 further includes a fifth portion G5 in between the gate spacers 220. In some embodiments, the fifth portion G5 has a smaller width than the second portion G1, because a distance between the gate spacers 220 is smaller than the widths of the openings O3 and O4.

Figure 20B:
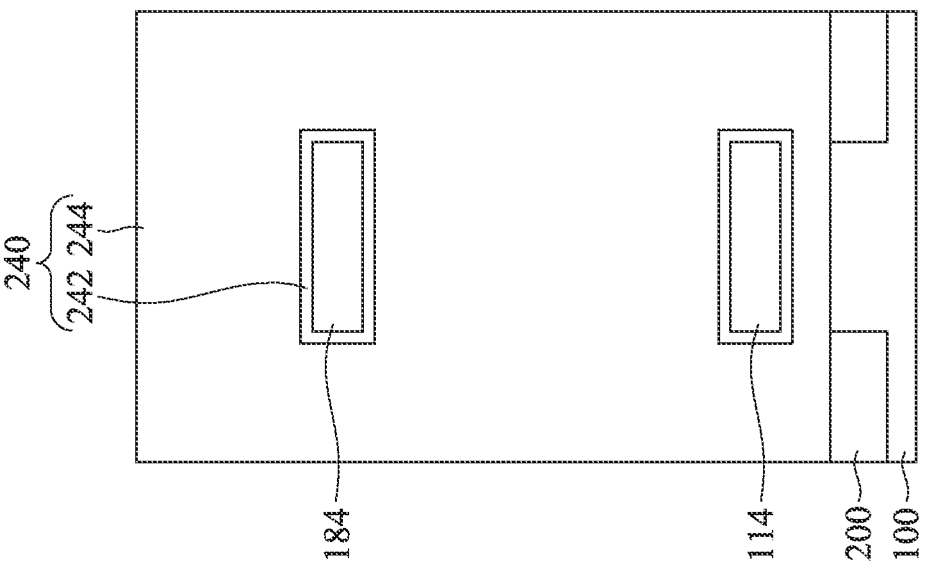
FIGS. 20A-20D illustrate a top view and cross-sectional views of an intermediate stage in the CFET structure fabrication, according to some embodiments of the present disclosure.
Figure 20A:
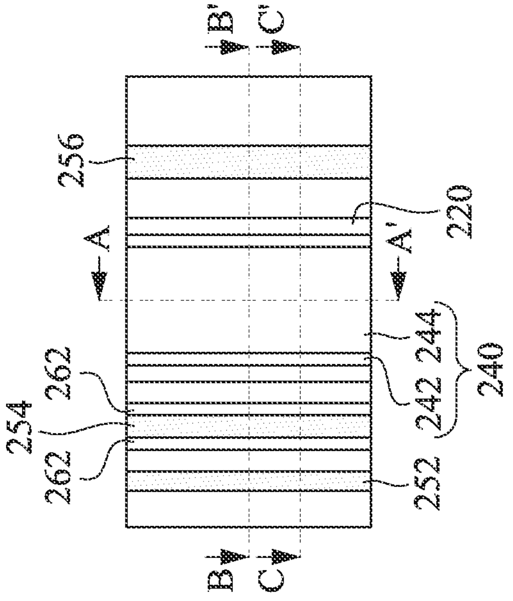
Figure 20D:
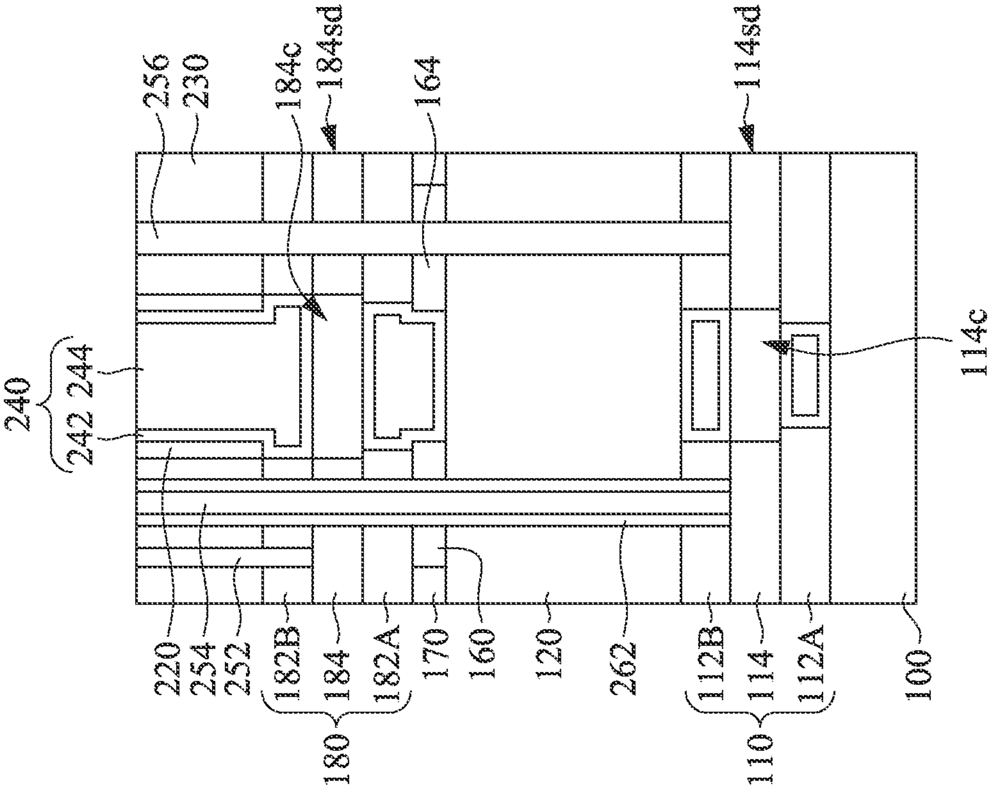
Figure 20C:
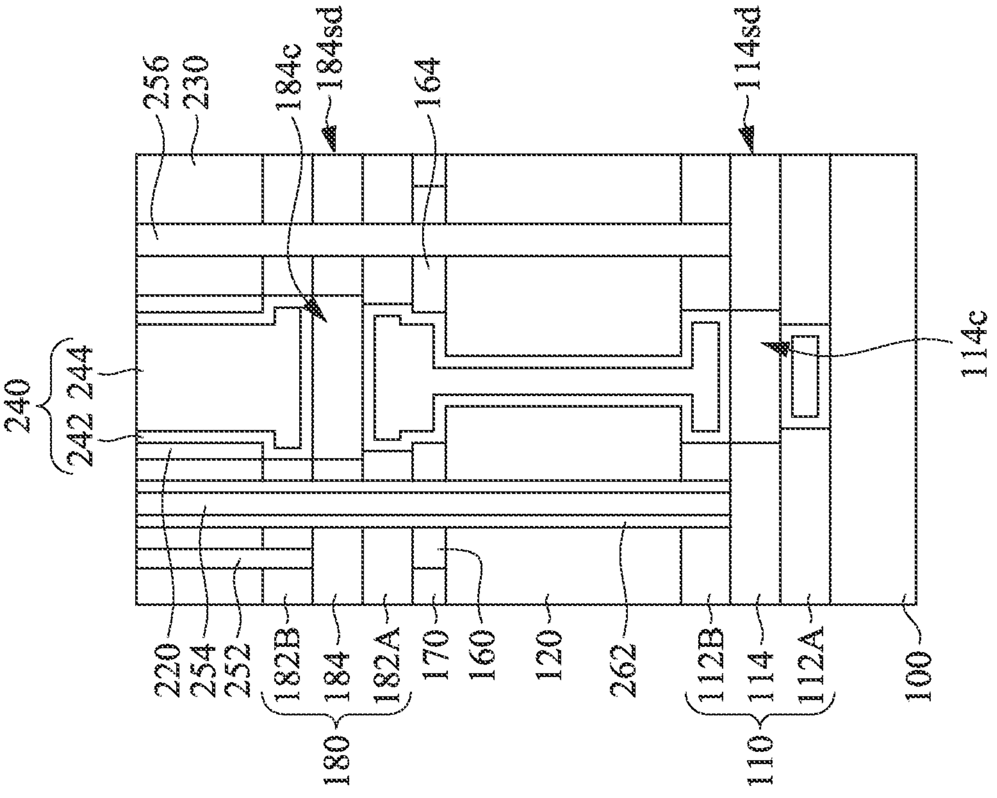

FIGS. 20A, 20B, 20C, and 20D illustrate a top view and cross-sectional views of a following stage in the CFET structure fabrication, wherein FIG. 20B is a cross-sectional view obtained from cut A-A' in FIG. 20A, FIG. 20C is a cross-sectional view obtained from cut B-B' in FIG. 20A, and FIG. 20D is a cross-sectional view obtained from cut C-C' in FIG. 20A. As illustrated in FIGS. 20A-20D, source/drain contacts 252, 254, and 256 are formed to make electrical connections to source/drain regions 114*sd* and 184*sd*. In some embodiments where the CFET structure functions as an inverter, the source/drain contact 252 extends through the ILD layer 230 and the dopant source layer 182B to reach a first source/drain region 184*sd* of a top-tier transistor; the source/drain contact 254 extends through the ILD layer 230, the top-tier epitaxial stack 180, the single-crystalline island 160, the inter-tier dielectric layer 120, the dopant source layer 112B to reach a first source/drain region 114*sd* of a bottom-tier transistor; and the source/drain contact 256 extends through the ILD layer 230, the top-tier epitaxial stack 180, the single-crystalline island 160, the inter-tier dielectric layer 120, the dopant source layer 112B to reach a second source/drain region 114*sd* of a bottom-tier transistor. In some embodiments, contact spacers 262 are formed on opposite sidewalls of the source/drain contact 254. The contact spacers 262 serve to electrically isolate the source/drain contact 254 from the source/drain regions 184*sd* of the top-tier transistor.

The source/drain contacts 252, 254, 256, and the contact spacers 262 can be formed by following example processing steps. First, an etching process is performed to form a first contact hole for the source/drain contact 254. Next, contact spacers 262 are formed lining sidewalls of the first contact hole by, for example, depositing a dielectric layer (e.g., silicon nitride) into the first contact hole, followed by removing horizontal portions from a bottom of the first contact hole using, e.g., an anisotropic etching process. Once the contact spacers 262 have been formed, the source/drain contact 254 is formed to fill the first contact hole by, for example, depositing one or more metals (e.g., cobalt, tungsten, aluminum, copper, or other suitable metals) overfilling the first contact hole, followed by performing a CMP process to remove excess metal materials outside the first contact hole. The source/drain contacts 252 and 256 can be formed using similar processing as formation of the source/drain contact 254, and can include same or similar materials as the material of the source/drain contact 254.

Figure 21:
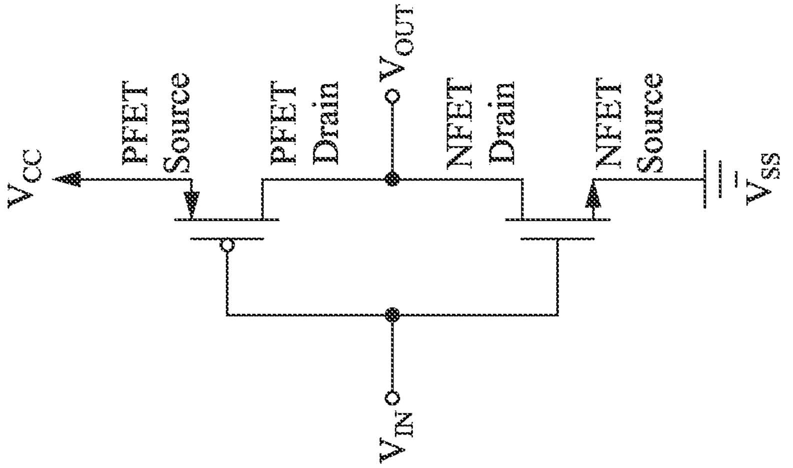
FIG. 21 is a circuit diagram of an inverter formed using the structure as illustrated in FIGS. 20A-20D, according to some embodiments of the present disclosure.

The first source/drain region 184*sd* of top-tier transistor (i.e., source of PFET) is electrically connected to a supply voltage $V_{CC}$ by using the source/drain contact 252. The source/drain contact 252 is thus interchangeably referred to as a $V_{CC}$ contact. The first source/drain region 114*sd* of bottom-tier transistor (i.e., source of NFET) is electrically connected to a reference voltage $V_{SS}$ by using the source/drain contact 254. The source/drain contact 254 is thus interchangeably referred to as a $V_{SS}$ contact. The common gate structure 240 shared by the top-tier transistor and bottom-tier transistor serves as an input terminal to receive an input voltage $V_{IN}$. The second source/drain region 184*sd* of top-tier transistor (i.e., drain of PFET) and the second source/drain region 114*sd* of bottom-tier transistor (i.e., drain of NFET) are collectively electrically coupled to an output terminal to provide an output voltage $V_{OUT}$ by using the common source/drain contact 256. The source/drain contact 256 is thus interchangeably referred to as a $V_{OUT}$ contact. The CFET structure can thus function as an inverter, as illustrated in the circuit diagram of FIG. 21.

Figure 22:
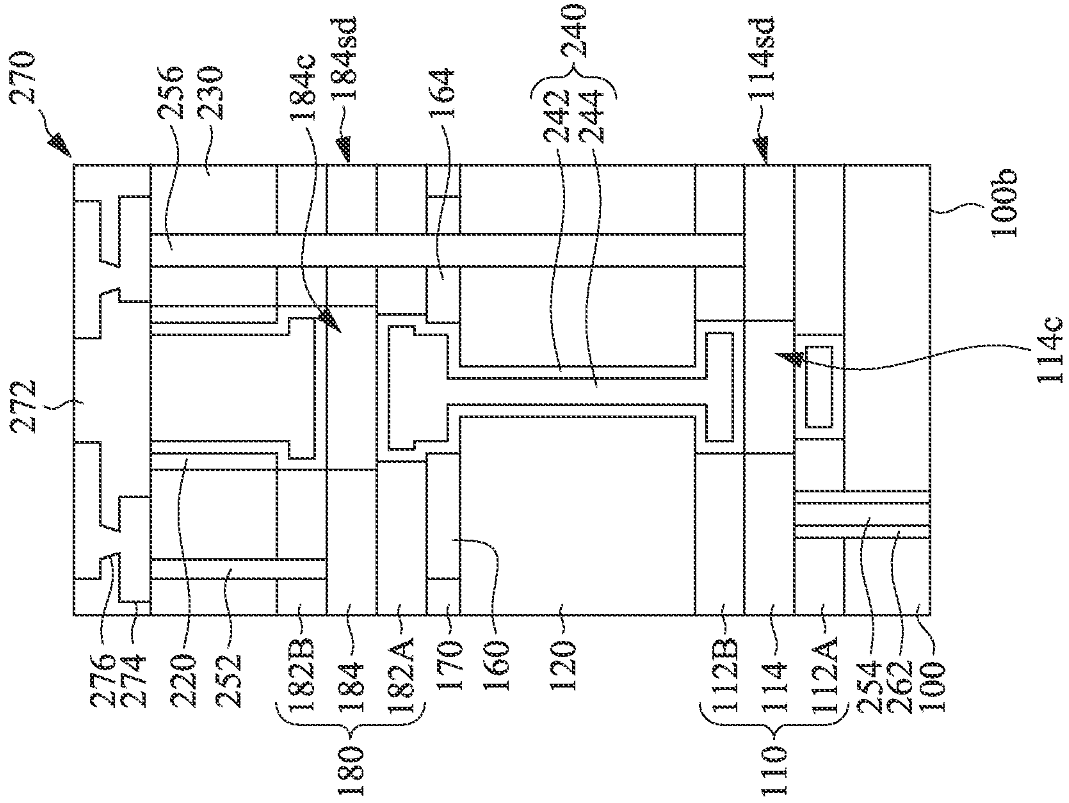

FIG. 22 illustrates a cross-sectional view of a CFET structure in some embodiments. The CFET structure is similar to that shown in FIG. 20C, except that the $V_{SS}$ contact 254 is formed as a backside contact that extends downwards from a backside of the first source/drain region 114*sd* of the bottom-tier transistor into the substrate 100. In some embodiments, after the $V_{CC}$ contact 252 and the $V_{OUT}$ contact 256 are formed, a front-side interconnect structure 270 is formed over the $V_{CC}$ contact 252, the $V_{OUT}$ contact 256, and the gate structure 240. The front-side interconnect structure 270 may be a multilayer interconnect (MLI) structure includes one or more inter-metal dielectric (IMD) layers 272, one or more metal lines 274 extending horizontally or laterally in a corresponding IMD layer 272 to distribute electrical signals and power laterally, and one or more metal vis 276 extending vertically in the one or more IMD layers 272 to distribute electrical signals and power vertically. A metal line 274 in the front-side interconnect structure 270 is in contact with the $V_{CC}$ contact 252 and serves to provide a supply voltage $V_{CC}$ to the first source/drain region 184*sd* of the top-tier transistor (i.e., source of PFET). A metal line 274 in the front-side interconnect structure 270 is in contact with the $V_{OUT}$ contact 256 and serves to receive an output voltage $V_{OUT}$ from the second source/drain region 114*sd* of bottom-tier transistor (i.e., drain of NFET) and the second source/drain region 184*sd* of top-tier transistor (i.e., drain of PFET) that are electrically coupled.

After the front-side interconnect structure 270 is formed, an etching process is performed on a backside surface 100*b* of the substrate 100 to form a backside contact hole extending from the backside substrate surface 100*b* to the first source/drain region 114*sd* of the bottom-tier transistor. Next, contact spacers 262 are formed lining sidewalls of the backside contact hole by, for example, depositing a dielectric layer (e.g., silicon nitride) into the backside contact hole, followed by removing horizontal portions from a bottom of the backside contact hole using, e.g., an anisotropic etching process. Once the contact spacers 262 have been formed, the source/drain contact 254 is formed to fill the backside contact hole by, for example, depositing one or more metals (e.g., cobalt, tungsten, aluminum, copper, or other suitable metals) overfilling the backside contact hole, followed by performing a CMP process to remove excess metal materials outside the backside contact hole.

Figure 23:
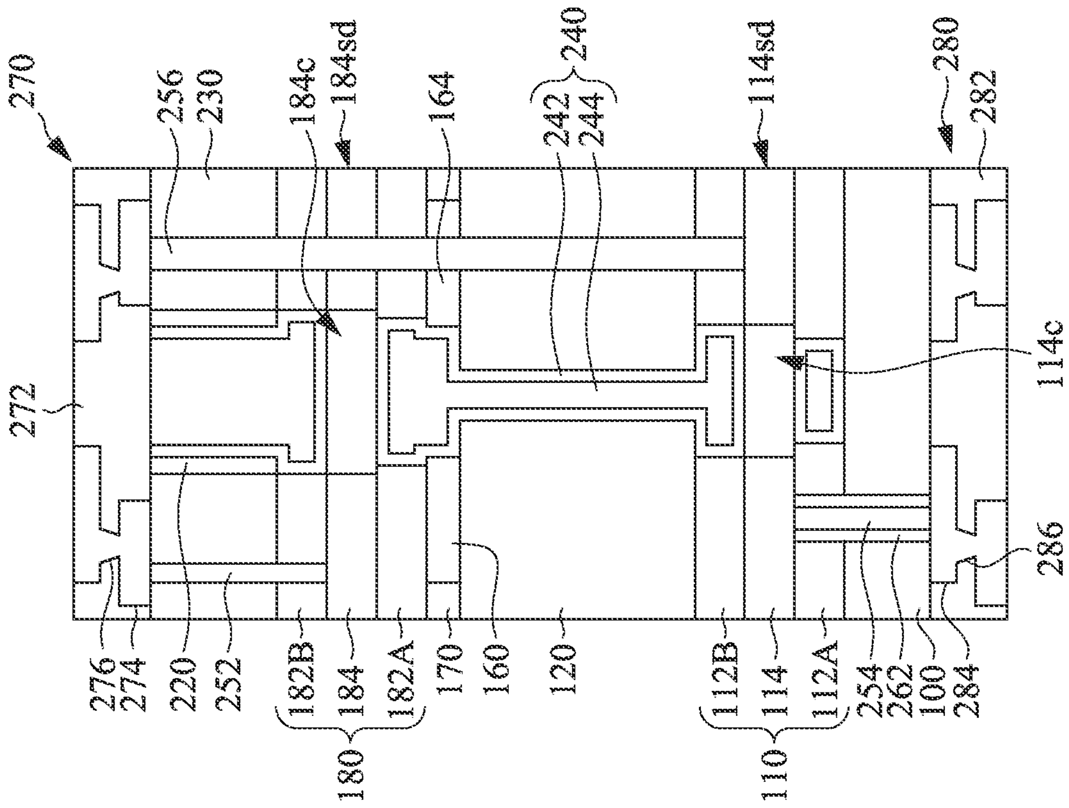
FIGS. 22-26 illustrate cross-sectional views of various CFET structures in various embodiments.

Once the backside $V_{SS}$ contact 254 is formed, a backside interconnect structure 280 is formed on the backside surface of the substrate 100, as illustrated in FIG. 23. The front-side interconnect structure 280 may be a multilayer interconnect (MLI) structure includes one or more inter-metal dielectric (IMD) layers 282, one or more metal lines 284 extending horizontally or laterally in a corresponding IMD layer 282 to distribute electrical signals and power laterally, and one or more metal vis 286 extending vertically in the one or more IMD layers 282 to distribute electrical signals and power vertically. A metal line 284 in the front-side interconnect structure 280 is in contact with the $V_{SS}$ contact 254 and serves to provide a reference voltage $V_{SS}$ to the first source/drain region 114*sd* of the bottom-tier transistor (i.e., source of NFET).

Figure 24:
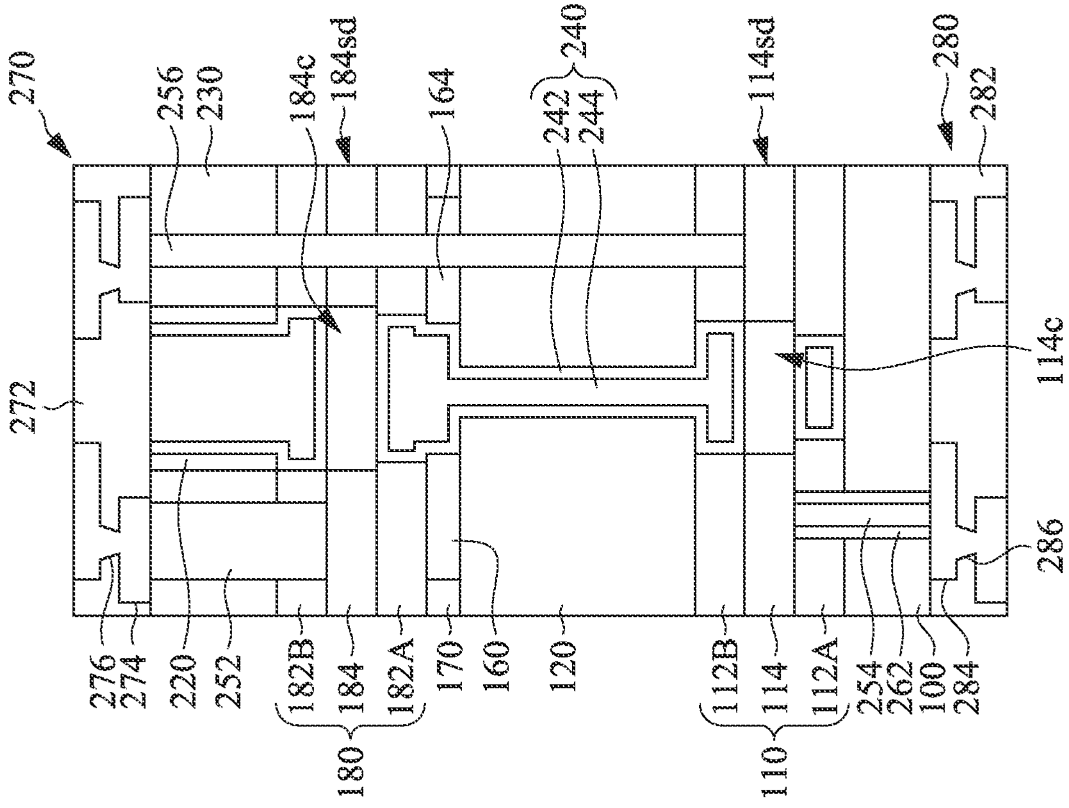

FIG. 24 illustrates a cross-sectional view of a CFET structure in accordance with some embodiments. The CFET is similar to that shown in FIG. 23, except that the $V_{CC}$ contact 252 vertically overlaps with the $V_{SS}$ contact 254. In particular, because the $V_{CC}$ contact 252 is formed at a different level height than the $V_{SS}$ contact 254, the $V_{CC}$ contact 252 can be formed without concerning about unwanted shorting between the $V_{CC}$ contact 252 and the $V_{SS}$ contact 254. Therefore, the $V_{CC}$ contact 252 can be formed with an enlarged width to reduce contact resistance. Even if the $V_{CC}$ contact 252 is enlarged to vertically overlap with the $V_{SS}$ contact 254, unwanted shorting between the $V_{CC}$ contact 252 and the $V_{SS}$ contact 254 can be prevented at least by the inter-tier dielectric layer 120.

Figure 25:
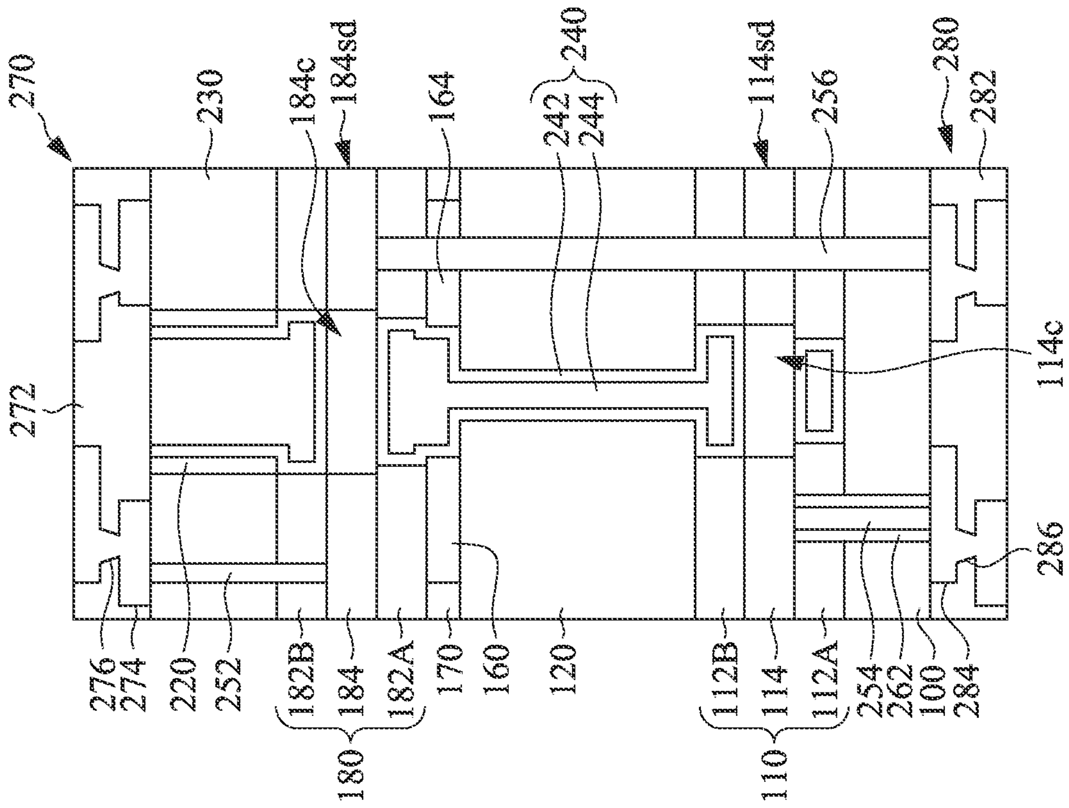

FIG. 25 illustrates a cross-sectional view of a CFET structure in accordance with some embodiments. The CFET is similar to that shown in FIG. 23, except that the $V_{OUT}$ contact 256 is formed as a backside contact that extends from a backside surface of the substrate 100 through second source/drain region 114*sd* of the bottom-tier transistor (i.e., drain of NFET) to the second source/drain region 184*sd* of the top-tier transistor (i.e., drain of PFET). In some embodiments, after the front-side interconnect structure 270 is formed, the backside $V_{SS}$ contact 254 is formed in the substrate 100 and the dopant source layer 112A, as described previously with respect to FIG. 23. Next, an etching process is performed on the backside surface of the substrate 100 to form a backside contact hole extending from the backside substrate surface through the second source/drain region 114*sd* of the bottom-tier transistor, the inter-tier dielectric layer 120, the single-crystalline island 160 to the second source/drain region 184*sd* of the top-tier transistor. The $V_{OUT}$ contact 256 is then formed to fill the backside contact hole by, for example, depositing one or more metals (e.g., cobalt, tungsten, aluminum, copper, or other suitable metals) overfilling the backside contact hole, followed by performing a CMP process to remove excess metal materials outside the backside contact hole. Once the backside $V_{OUT}$ contact 256 is formed, the backside interconnect structure 280 is formed on the backside surface of the substrate 100, as described previously with respect to FIG. 23.

Figure 26:
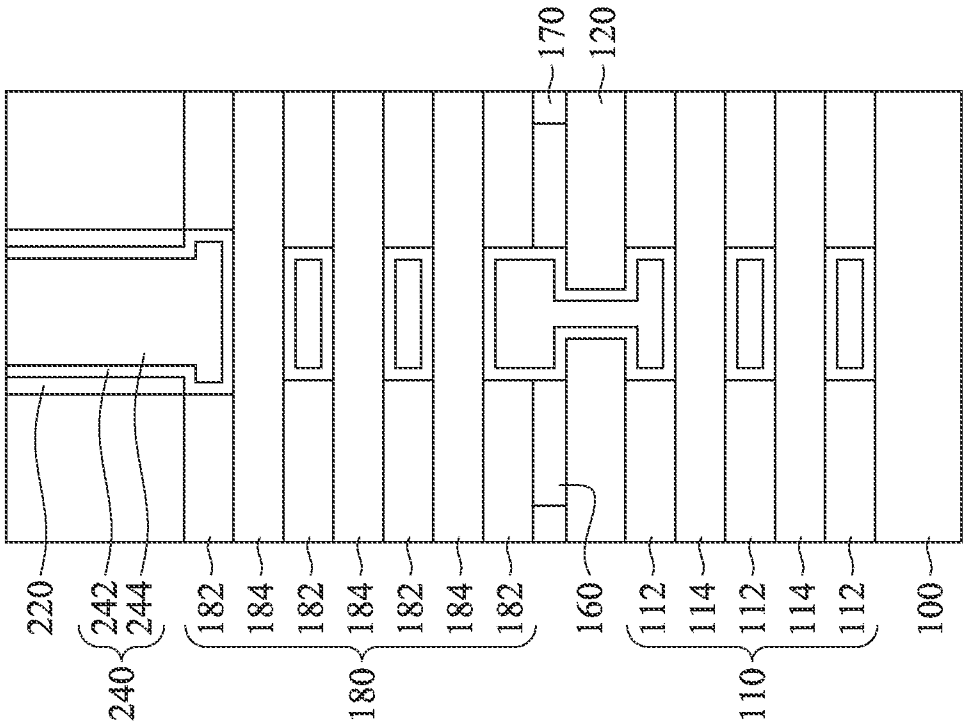

FIG. 26 illustrates a cross-sectional view of a CFET structure in accordance with some embodiments. The CFET is similar to that shown in FIG. 19C, except that the bottom-tier epitaxial stack 110 includes a different number of epitaxial layers that that shown in FIG. 19C, and the top-tier epitaxial stack 180 also includes a different number of epitaxial layers that shown in FIG. 19C. In particular, as illustrated in FIG. 26, the bottom-tier epitaxial stack 110 includes three dopant source layers 112 alternating with two semiconductor active layers 114, and the top-tier epitaxial stack 180 includes four dopant source layers 182 alternating with three semiconductor active layers 184. In the illustrated embodiment, a total number of the bottom-tier dopant source layers 112 is less than a total number of the top-tier dopant source layers 182, and a total number of the semiconductor active layers 114 is less than a total number of the semiconductor active layers 184. In some other embodiments, a total number of the bottom-tier dopant source layers 112 may be greater than a total number of the top-tier dopant source layers 182, and a total number of the semiconductor active layers 114 may be greater than a total number of the semiconductor active layers 184.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the CFET structures comprising top-tier transistors and top-tier transistors can be formed without wafer bonding. Another advantage is that thermal budget of top-tier transistors will not be constrained by reliability concerns about bottom-tier transistors. Another advantage is a reduced footprint of inverter because the inverter includes vertically stacked transistors. Another advantage is that source/drain epitaxial regrowth can be omitted, because the source/drain regions are formed by thermal diffusion using epitaxial layers in the epitaxial stacks as dopant sources.

In some embodiments, a device comprises a first semiconductor layer, a dielectric layer, a second semiconductor layer, and a gate structure. The first semiconductor layer is over a substrate. The first semiconductor layer comprises a first channel region and first source/drain regions on opposite sides of the first channel region. The dielectric layer is over the first semiconductor layer. The second semiconductor layer is over the dielectric layer. The second semiconductor layer comprises a second channel region and second source/drain regions on opposite sides of the second channel region. The gate structure comprises a first portion extending in the dielectric layer, a second portion wrapping around the first channel region of the first semiconductor layer, and a third portion wrapping around the second channel region of the second semiconductor layer. In some embodiments, the first portion of the gate structure in the dielectric layer has a width less than a width of the second portion of the gate structure wrapping around the first channel region. In some embodiments, the first portion of the gate structure in the dielectric layer has a width less than a width of the third portion of the gate structure wrapping around the second channel region. In some embodiments, the first source/drain regions are of n-type, and the second source/drain regions are of p-type. In some embodiments, the first source/drain regions are of p-type, and the second source/drain regions are of n-type. In some embodiments, the device further comprises first dopant source layers sandwiching the first source/drain regions of the first semiconductor layer, and the first dopant source layers have a same dopant as the first source/drain regions. In some embodiments, the device further comprises second dopant source layers sandwiching the second source/drain regions of the second semiconductor layer, and the second dopant source layers have a same dopant as the second source/drain regions. In some embodiments, the first dopant source layers and the second dopant source layers are of opposite conductivity types. In some embodiments, the device further comprises a single-crystalline island between the dielectric layer and a lower one of the second dopant source layers. In some embodiments, the gate structure further comprises a fourth portion in the single-crystalline island, and the fourth portion has a width greater than a width of the first portion of the gate structure.

In some embodiments, a device comprises an n-type transistor, a p-type transistor, a dielectric layer, and a gate structure. The n-type transistor is over a substrate. The p-type transistor is at a different level height than the n-type transistor. The dielectric layer interposes the n-type transistor and the p-type transistor. The gate structure is shared by the n-type transistor and the p-type transistor. The gate structure comprises a first portion around a channel region of the n-type transistor and a second portion around a channel region of the p-type transistor. The second portion of the gate structure has a width greater than a width of the first portion of the gate structure. In some embodiments, the gate structure further comprises a third portion in the dielectric layer, and the third portion has a width less than the width of the second portion of the gate structure. In some embodiments, the width of the third portion of the gate structure is less than the width of the first portion of the gate structure. In some embodiments, the device further comprises a single-crystalline island on the dielectric layer. In some embodiments, the gate structure further comprises a third portion in the single-crystalline island, and the third portion has a width less than a width of the second portion of the gate structure.

In some embodiments, a method comprises forming a first epitaxial stack on a substrate, the first epitaxial stack comprising first doped layers and a first semiconductor layer interposing the first doped layers; forming a dielectric layer over the first epitaxial stack; forming a second epitaxial stack over the dielectric layer, the second epitaxial stack comprising second doped layers and a second semiconductor layer interposing the second doped layers; removing portions of the first doped layers and portions of the second doped layers, such that a channel region of the first semiconductor layer and a channel region of the second semiconductor layer are suspended above the substrate; performing a first annealing process to diffuse a first dopant from the first doped layers to source/drain regions of the first semiconductor layer and to diffuse a second dopant from the second doped layers to source/drain regions of the second semiconductor layer; and forming a gate structure surrounding the channel region of the first semiconductor layer and the channel region of the second semiconductor layer. In some embodiments, the first dopant and the second dopant are of opposite conductivity types. In some embodiments, the method further comprises performing an etching process on the dielectric layer to form a hole in the dielectric layer; depositing a non-single crystalline semiconductor material in the hole; and performing a second annealing process to crystallize the non-single crystalline semiconductor material into a single-crystalline semiconductor material, wherein the second epitaxial stack is formed on the single-crystalline semiconductor material. In some embodiments, the method further comprises forming a first source/drain contact on a first one of the source/drain regions of the second semiconductor layer; and forming a second source/drain contact extending through a second one of the source/drain regions of the second semiconductor layer to a first one of the source/drain regions of the first semiconductor layer. In some embodiments, the method further comprises forming contact spacers lining opposite sidewalls of the second source/drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a first semiconductor layer over a substrate, the first semiconductor layer comprising a first channel region and first source/drain regions on opposite sides of the first channel region;

a dielectric layer over the first semiconductor layer;

a second semiconductor layer over the dielectric layer, the second semiconductor layer comprising a second channel region and second source/drain regions on opposite sides of the second channel region; and a gate structure comprising a first portion extending in the dielectric layer, a second portion wrapping around the first channel region of the first semiconductor layer, and a third portion wrapping around the second channel region of the second semiconductor layer, wherein the first portion of the gate structure in the dielectric layer interfaces opposite sidewalls of the dielectric layer, wherein a distance between the opposite sidewalls of the dielectric layer is less than a maximal width of the second portion of the gate structure wrapping around the first channel region.

2. The device of claim 1, wherein the distance between the opposite sidewalls of the dielectric layer is less than a maximal width of the third portion of the gate structure wrapping around the second channel region.

3. The device of claim 1, wherein the first source/drain regions are of n-type, and the second source/drain regions are of p-type.

4. The device of claim 1, wherein the first source/drain regions are of p-type, and the second source/drain regions are of n-type.

5. The device of claim 1, further comprising:

first dopant source layers sandwiching the first source/drain regions of the first semiconductor layer, the first dopant source layers having a same dopant as the first source/drain regions.

6. The device of claim 5, further comprising:

second dopant source layers sandwiching the second source/drain regions of the second semiconductor layer, the second dopant source layers having a same dopant as the second source/drain regions.

7. The device of claim 6, wherein the first dopant source layers and the second dopant source layers are of opposite conductivity types.

8. The device of claim 6, further comprising:

a single-crystalline island between the dielectric layer and a lower one of the second dopant source layers.

9. The device of claim 8, wherein the gate structure further comprises a fourth portion in the single-crystalline island, and the fourth portion has a maximal width greater than the distance between the opposite sidewalls of the dielectric layer.

10. A device comprising:

an n-type transistor over a substrate, the n-type transistor comprising first source/drain regions;

a p-type transistor at a different level height than the n-type transistor, the p-type transistor comprising second source/drain regions, wherein a shortest distance between the second source/drain regions is greater than a shortest distance between the first source/drain regions;

a dielectric layer interposing the n-type transistor and the p-type transistor; and a gate structure shared by the n-type transistor and the p-type transistor, wherein the gate structure comprises a first portion around a channel region of the n-type transistor and a second portion around a channel region of the p-type transistor, and the second portion of the gate structure has a maximal width greater than a maximal width of the first portion of the gate structure.

11. The device of claim 10, wherein the gate structure further comprises a third portion in the dielectric layer, and the third portion has a maximal width less than the maximal width of the second portion of the gate structure.

12. The device of claim 11, wherein the maximal width of the third portion of the gate structure is less than the maximal width of the first portion of the gate structure.

13. The device of claim 10, further comprising:

a single-crystalline island on the dielectric layer.

14. The device of claim 13, wherein the gate structure further comprises a third portion in the single-crystalline island, and the third portion has a width less than a width of the second portion of the gate structure.

15. A method comprising:

forming a first epitaxial stack on a substrate, the first epitaxial stack comprising first doped layers and a first semiconductor layer interposing the first doped layers, wherein the first semiconductor layer has a top surface covered by one of the first doped layers;

forming a dielectric layer over the first epitaxial stack, wherein an interface formed by the dielectric layer and the first epitaxial stack is parallel with the top surface of the first semiconductor layer;

forming a second epitaxial stack over the dielectric layer, the second epitaxial stack comprising second doped layers and a second semiconductor layer interposing the second doped layers;

removing portions of the first doped layers and portions of the second doped layers, such that a channel region of the first semiconductor layer and a channel region of the second semiconductor layer are suspended above the substrate;

performing a first annealing process to diffuse a first dopant from the first doped layers to source/drain regions of the first semiconductor layer and to diffuse a second dopant from the second doped layers to source/drain regions of the second semiconductor layer; and forming a gate structure surrounding the channel region of the first semiconductor layer and the channel region of the second semiconductor layer.

16. The method of claim 15, wherein the first dopant and the second dopant are of opposite conductivity types.

17. The method of claim 15, further comprising:

performing an etching process on the dielectric layer to form a hole in the dielectric layer;

depositing a non-single crystalline semiconductor material in the hole; and performing a second annealing process to crystallize the non-single crystalline semiconductor material into a single-crystalline semiconductor material, wherein the second epitaxial stack is formed on the single-crystalline semiconductor material.

18. The method of claim 15, further comprising:

forming a first source/drain contact on a first one of the source/drain regions of the second semiconductor layer; and forming a second source/drain contact extending through a second one of the source/drain regions of the second semiconductor layer to a first one of the source/drain regions of the first semiconductor layer.

19. The device of claim 1, wherein the dielectric layer has a thickness measured in a direction perpendicular to the substrate greater than a thickness of the first source/drain regions measured in the direction.

20. The device of claim 1, wherein the distance between the opposite sidewalls of the dielectric layer is less than a shortest distance between the first source/drain regions.

* * * * *